US009006296B2

(12) United States Patent
Itoh et al.

(10) Patent No.: US 9,006,296 B2
(45) Date of Patent: Apr. 14, 2015

(54) METAL NANOPARTICLE DISPERSION USABLE FOR EJECTION IN THE FORM OF FINE DROPLETS TO BE APPLIED IN THE LAYERED SHAPE

(75) Inventors: Daisuke Itoh, Ibaraki (JP); Akihito Izumitani, Ibaraki (JP); Noriaki Hata, Ibaraki (JP); Yorishige Matsuba, Ibaraki (JP); Kazuhiro Murata, Ibaraki (JP); Hiroshi Yokoyama, Ibaraki (JP)

(73) Assignees: Harima Chemicals, Inc., Kakogwa-shi (JP); SIJ Technology, Inc., Tsukuba (JP); National Institute of Advanced Industrial Science and Technology, Tokyo (JP)

( * ) Notice: Subject to any disclaimer, the term of this patent is extended or adjusted under 35 U.S.C. 154(b) by 1808 days.

(21) Appl. No.: 10/571,507

(22) PCT Filed: Sep. 10, 2004

(86) PCT No.: PCT/JP2004/013229
§ 371 (c)(1),
(2), (4) Date: Mar. 10, 2006

(87) PCT Pub. No.: WO2005/025787
PCT Pub. Date: Mar. 24, 2005

(65) Prior Publication Data
US 2007/0098883 A1 May 3, 2007

(30) Foreign Application Priority Data

Sep. 12, 2003 (JP) .................................. 2003-322043

(51) Int. Cl.
| | | |
|---|---|---|
| *B05D 1/12* | (2006.01) | |
| *C09D 5/24* | (2006.01) | |
| *C09D 11/52* | (2014.01) | |
| *C09D 17/00* | (2006.01) | |
| *H01B 1/00* | (2006.01) | |
| *H01B 1/02* | (2006.01) | |
| *H01B 1/22* | (2006.01) | |
| *H05K 1/09* | (2006.01) | |
| *H05K 3/12* | (2006.01) | |
| *B22F 9/00* | (2006.01) | |

(52) U.S. Cl.
CPC *H05K 3/125* (2013.01); *C09D 5/24* (2013.01); *C09D 17/006* (2013.01); *H01B 1/02* (2013.01); *H01B 1/22* (2013.01); *H05K 2201/0257* (2013.01); *H05K 2203/013* (2013.01)

(58) Field of Classification Search
USPC ......... 516/31; 252/514, 519.2, 519.21, 519.3, 252/519.34; 106/1.18, 1.19, 1.21; 427/190, 427/191, 192, 376.7; 438/100
See application file for complete search history.

(56) References Cited

U.S. PATENT DOCUMENTS

| | | | |
|---|---|---|---|
| 5,785,897 | A | 7/1998 | Toufuku et al. |
| 5,922,403 | A * | 7/1999 | Tecle ........................... 427/212 |
| 6,103,868 | A * | 8/2000 | Heath et al. .................. 528/482 |
| 6,190,731 | B1 * | 2/2001 | Tecle ........................ 427/213.3 |
| 7,708,910 | B2 * | 5/2010 | Abe et al. ..................... 252/512 |
| 2003/0077625 | A1 * | 4/2003 | Hutchison ......................... 435/6 |
| 2003/0110978 | A1 * | 6/2003 | Abe et al. .................. 106/31.13 |
| 2003/0116057 | A1 | 6/2003 | Suzuki et al. |
| 2004/0043691 | A1 | 3/2004 | Abe et al. |

FOREIGN PATENT DOCUMENTS

| | | | |
|---|---|---|---|
| EP | 1 339 073 A1 | | 8/2003 |
| JP | 3-34211 | | 2/1991 |
| JP | 10-204350 | | 8/1998 |
| JP | 11-319538 | | 11/1999 |
| JP | 2001035814 A | * | 2/2001 |
| JP | 2002-334618 A | * | 11/2002 |
| TW | 375649 | | 12/1999 |
| TW | 548316 | | 8/2003 |
| WO | WO 02/01808 A1 | | 3/2002 |

OTHER PUBLICATIONS

Machine Translation of Publ. No. JP 2002-334618, published Nov. 2002, Japan patent Office, Tokyo, Japan, obtained online @ http://dossier1.ipdl.inpit.go.jp/AIPN/odse_top_dn.ipdl?N0000=7400 (Downloaded May 19, 2012).*
JPO on EAST, Patent Abstracts of Japan, Japan patent Office, Tokyo, Japan, JP 2002334618 A (Nov. 2002), Abstract.*
JPO on EAST, Patent Abstracts of Japan, Japan patent Office, Tokyo, Japan, JP 2001035814 A (Feb. 2001), Abstract.*
Machine Translation of Publ. No. JP 2001-035814 , published Feb. 2001, Japan patent Office, Tokyo, Japan, obtained online @ http://dossier1.ipdl.inpit.go.jp/AIPN/odse_top_dn.ipdl?N0000=7400 (Downloaded Feb. 19, 2014).*
Sawyer B. Fuller, et al., Ink-Jet Printed Nanoparticle Microelectromechanical Systems, Journal of Microelectromechanical Systems. vol. II No. 1, Feb. 2002.
Supplementary European Search Report issued by the European Patent Office on Sep. 29, 2010 for the counterpart European Patent Application No. 04787869.9.

* cited by examiner

*Primary Examiner* — Daniel S Metzmaier
(74) *Attorney, Agent, or Firm* — Knobbe Martens Olson & Bear LLP

(57) ABSTRACT

According to the present invention, a metal nanoparticle dispersion suitable to multiple layered coating by jetting in the form of fine droplets is prepared by dispersing metal nanoparticles having an average particle size of 1 to 100 nm in a dispersion solvent having a boiling point of 80° C. or higher in such a manner that the volume percentage of the dispersion solvent is selected in the range of 55 to 80% by volume and the fluid viscosity (20° C.) of the dispersion is chosen in the range of 2 mPa·s to 30 mPa·s, and then when the dispersion is discharged in the form of fine droplets by inkjet method or the like, the dispersion is concentrated by evaporation of the dispersion solvent in the droplets in the course of flight, coming to be a viscous dispersion which can be applicable to multi-layered coating.

20 Claims, 2 Drawing Sheets

METAL NANOPARTICLE DISPERSION USABLE FOR EJECTION IN THE FORM OF FINE DROPLETS TO BE APPLIED IN THE LAYERED SHAPE

This application is the U.S. National Phase under 35 U.S.C. §371 of International Application PCT/JP2004/013229, filed Sep. 10, 2004, which claims priority to Japanese Patent Application No. 2003-322043, filed Sep. 12, 2003. The International Application was not published under PCT Article 21(2) in English.

TECHNICAL FIELD

The present invention relates to a conductive metal nanoparticle dispersion having high fluidity, a process for preparing the same and a method of using the conductive metal nanoparticle dispersion, and more specifically metal nanoparticle dispersion applicable to formation of a coating layer being thick in thickness relative to its fine surface pattern size on a substrate by means of inkjet printing, and thus usable for forming a sintered product layer of metal nanoparticles having a high aspect ratio, and to a process for forming a sintered product layer of metal nanoparticles in fine shape with a high aspect ratio with use of the same.

BACKGROUND ART

Metal plated films have been widely employed for wiring patterns provided on a mounting board as well as pads at the sites for jointing between semiconductor devices and wiring patterns, which are used in assembling of semiconductor devices so far. Along with recent improvement in the technique of drawing fine patterns using inkjet printing, application of formation of wiring pattern using a conductive metal paste is under way. In addition, application to finer wiring patterns is now advanced by making the particle size of the metal filler used in the conductive metal paste much smaller.

On the other hand, there are established methods of producing metal ultrafine particles having an extremely small particle size, such as metal ultrafine particles with at least their average particle size of 100 nm or less. For example, JP 3-34211 A1 discloses a dispersion in which ultrafine particles of 10 nm or less prepared by a gas evaporation method are dispersed in a dispersion solvent in the form of colloid and a process for producing the same (see JP 3-34211 A1). Further, there have been disclosed, for example in JP 11-319538 A1, colloid dispersions of ultrafine particles having an average particle size of several nm to several 10 nm prepared by a wet process utilizing a method of reduction/precipitation with an amine compound for reduction and a process for production thereof (see JP 11-319538 A1).

As such metal nanoparticles having a nanosize average particle size have been employed as a conductive medium, a conductive layer formed by using such conductive paste is now applicable to formation of extremely fine wiring pattern. When a metal filler of several microns in the size is used for conductive metal paste, the metal filler particles are closely adhered and fixed with each other by using a binder resin to create electrically conductive paths. On the other hand, when a similar technique for making physical contact of particles is used for ultrafine metal particles having an average particle size of several nm to several 10 nm, the smaller the average particle size, the more remarkable the increase in the entire resistivity due to contact resistance.

Generally, ultrafine metal particles having an average particle size of several nm to several 10 nm are known to be sintered at a temperature well below the melting point (for example, even at 200° C. or lower in the case of silver ultrafine particles having a clean surface). This is because, when the particle size of ultrafine metal particles is sufficiently small, the proportion of atoms in a high energy state present on the particle surface increases in the whole particle, and thereby the surface diffusion of metal atoms is increased to a far from negligible level, and as a result, the boundary between the particles are grown wider due to this surface diffusion to cause sintering. In the case of using metal nanoparticles as a conductive medium, this characteristic of being sinterable at low temperatures is utilized to form a network-like sintered product layer of metal nanoparticles closely contacted with each other by sintering, and as a result, the increase in the entire resistivity due to contact resistance is suppressed and such a good electrical conductivity is achieved as a lowered specific resistivity of about $10 \times 10^{-6}$ $\Omega$·cm for the entire sintered product layer of metal nanoparticles.

It is desired that when used wiring patterns are further miniaturized with narrower line widths, the thickness of the wiring layer in the wiring part with the narrower line width is thicker relative to the line width to increase the thickness/width ratio in the cross-section of the wiring layer in order to prevent the rapid increase in the resistance of the wiring. For example, in the case of metal plated films formed by means of electrolytic plating, metal is deposited even on the edges of the line when the line width is narrower and the plating thickness is increased; and therefore it is difficult to form a plated film having a narrow line width and a high thickness/width ratio with maintaining integrity of the desired finer wiring pattern. On the other hand, in the case of wiring pattern formation using a conductive metal paste, when the fluidity of the conductive metal paste used is high, the paste runs off from the edges on both sides of a line due to the high fluidity of the paste even if the paste is coated at the intended thickness/width ratio. Thus, it is also difficult to form a conductive metal paste coating layer having a narrow line width and a high thickness/width ratio with maintaining integrity of the desired finer wiring pattern.

As a technique for forming a thick plated film with an edge being kept in sharp shape, a method is known in which a mask for plating is beforehand prepared using a resist film or the like and then an electroplated film is formed in alignment with the opening shape of the plating mask. In that case, it is necessary that such a mask for plating having an opening with a high thickness (depth)/width ratio for the narrower widths should be provided, but there has been not yet developed a technique having wide applicability that can form easily such opening with a high thickness (depth)/width ratio by using a resist film. Likewise, in the case of wiring pattern formation using a conductive metal paste, leak-out from the edge on both sides of a line can be prevented when a mask formed by using a resist film is used, but there has been not yet developed a method of preparing mask usable for various purposes that can form easily an opening with a high thickness (depth)/width ratio. In particular, when the proportion of the dispersion solvent contained in the used conductive metal paste is increased to obtain high fluidity, vapor of the dispersion solvent forms accidentally bubbles inside the opening groove at the stage of removing the dispersion solvent contained in the coating layer by evaporation after application, which may be a main cause resulting in incident of voids.

At least, there has not been yet developed a technique of easily forming a conductive layer having a cross-section of a high thickness (depth)/width ratio, e.g., a pillar-shape having a circular base in which the height is equal to or greater than the radius of the base, by using a conductive metal paste dispersion with a high fluidity that is suitable for application by deposition or inkjet, by means of a method of forming a wiring pattern using a conventional conductive metal paste.

DISCLOSURE OF THE INVENTION

As described above, along with narrowing of line widths of wiring used for a wiring pattern, which is formed on a substrate of wiring circuit, it is desired to develop a technique for forming a conductive wiring layer with wide applicability and high reproducibility, which may successfully increase the thickness/width ratio of a cross-section of the wiring layer employed, particularly in a narrow line portion. Particularly, in view of wider applicability in drawing of wiring patterns, it is desired to develop a technique for forming a conductive wiring layer with high reproducibility, which can increase the thickness/width ratio of a cross-section of the wiring layer by a coating process which requires no mask and in which droplets of a conductive metal paste dispersion are discharged and coated in line with the intended coating pattern by deposition or inkjet, instead of such a method using a beforehand prepared mask pattern as screen printing.

More specifically, when a conductive wiring layer is formed from a conductive metal paste dispersion in making of a wiring pattern having a fine minimum line width, be ultra-fine metal particles having an average particle size of several nm to several 10 nm need to be employed for the conductive medium (metal filler) used therein, in order to achieve drawing accuracy of fine line-width, for example, drawing accuracy and controllability of line width at sub-micron level. Specifically, it is desired to develop a technique for forming a conductive wiring layer with such a high thickness/minimum width ratio that a thickness of more than 10 μm is chosen finally for a minimum line width of less than 10 μm by means of drawing a coating layer by inkjet with use of a metal nanoparticle dispersion which contains, as a conductive medium, ultra-fine metal particles having an average particle size of several nm to several 10 nm in a dispersion solvent thereof, easily with high reproducibility. It is also desired to develop a metal nanoparticle dispersion having high fluidity suitably used for drawing of a coating layer having such a high thickness/minimum width ratio by inkjet.

The present invention has been made in order to solve the aforementioned problems, and an object of the present invention is to provide a dispersion of conductive metal paste type that employs only metal nanoparticles as a conductive medium, which is useful for forming an electroconductive layer having such an extremely fine pattern as a circular pattern having a diameter of several μm and a high thickness/minimum width ratio in the cross-section, and which has high fluidity adapted to successful application of inkjet when forming such fine pattern at high accuracy; and to provide a method for preparing an electroconductive layer having an extremely fine pattern and enough high thickness/minimum width ratio in the cross-section to exhibit excellent conductive properties, using said metal nanoparticle dispersion of conductive metal paste type. More specifically, an object of the present invention is to provide a metal nanoparticle dispersion having a novel constituent, which can form an extremely fine pattern and heighten the thickness/minimum width ratio in the cross-section to 1/1 or higher when a coating layer drawn in the shape of a fine wiring pattern using a metal nanoparticle dispersion is heat-treated at a low temperature to form an electroconductive layer of sintered product type in which the metal nanoparticles are sintered up at the low temperature; and which can achieve a superior conductive properties at high reproducibility that the specific resistivity of the resulted electroconductive layer of sintered product type having extremely fine pattern is within 10 times or preferably within 5 times the specific resistivity of the bulk of the metal material constituting said metal nanoparticles, and thus which is capable of producing a conductive body of fine sintered product type which possesses stably good conductive properties with high reliability.

In the course of intensive studies to solve the above-described problems, the present inventors have reached the following finding: in conductive metal paste containing fine powder of metal filler having an average particle size of about 0.5 μm, a binder resin is an essential component which has a role of increasing mechanical contact between particles of the fine powder of metal filler as the resin is thermally cured or shrunk, and also serves as a binder for condensing the entire electroconductive layer and as an adhesive resin for adhering the layer to a substrate; however, in the case when a sintered product layer is integrally composed of metal nanoparticles that are closely contacted with each other also in the film thickness direction, it is not necessary to utilize the functions of the binder of increasing mechanical contact between metal nanoparticles present on the surface of each sintered product among those sintered bodies as well as of condensing the entire electroconductive layer, and thus such a binder resin component is no longer an essential component.

On the other hand, it has also been confirmed that, since metal nanoparticles form an aggregate having a relatively small bulk specific gravity by mutual fusion upon direct contact of the metal surfaces, it is preferable to form a molecular covering layer on the metal nanoparticle surface to avoid direct contact of the metal surfaces of metal nanoparticles in order to keep a uniform dispersion state of metal nanoparticles in a dispersion solvent. When a dispersion of metal nanoparticles having such a molecular covering layer on the surface is coated and the molecular covering layer is removed from the surface simultaneously with removal of the contained dispersion solvent by evaporation, low temperature sintering among closely stacked metal nanoparticles is initiated at the sites where the surfaces of the spherical fine metal particles are directly contacted with each other when the molecular covering layer on the surface is removed and, whereby a sintered product layer of metal nanoparticles is formed. In such a process, since aggregation and volume shrinkage occur along with the progress of low temperature sintering, it is necessary to remove a liquid phase component filling the space between spherical fine metal particles. It has been found that when the residual proportion of the contained dispersion solvent is in advance reduced upon forming a coated film to make metal nanoparticles being in as close stacked condition as those in a closest packing state, the sintered product layer of close-packed metal nanoparticles to be formed will be more densely compacted, and so the specific resistivity of the electroconductive layer resulted can be markedly reduced.

It has been found that, as a dispersion solvent, preferably used is an organic solvent that has high affinity for covering molecules, which serves as a releasing solvent for separating covering molecules from the surface by eluting upon heating; and that, in order to put metal nanoparticles in as close stacked state as in the closest packing state, the dispersion is preferably coated in such a manner that the unnecessary dispersion solvent can be promptly removed by evaporation. Specifically, it has been found that, to apply the dispersion by inkjet, it need to be the dispersion having enough high fluidity to discharge by spraying as fine droplets of the dispersion from the tip of a nozzle having a small opening diameter, but once the dispersion is discharged as fine droplets by spraying, the excess amount of dispersion solvent, which corresponds to the dispersion solvent for dilution that is added for the purpose of attaining such a high fluidity, is no longer of any use. In other words, it has been found that at the point of time when the fine droplets discharged by spraying come into impact with the surface to be coated, their fluidity may be decreased to such a low level as that being appropriate for screen printing, and thereby they may be in such a condition that the viscosity is so increased.

A more detailed study has revealed that in the case of fine droplets discharged by spraying, the surface area thereof compared to the volume is relatively increased in inverse proportion to the diameter of the droplet, and thus release of the dispersion solvent by evaporation is facilitated. However, because the particle size of the metal nanoparticle contained therein is extremely small, the dispersion solvent present in the narrow space between particles is brought to a state similarly to being filled in capillaries when ratio of the space to the particle size is below certain levels, and after that, further release of the dispersion solvent by evaporation proceed only slowly. Accordingly, it has been revealed that although the excess of dispersion solvent quickly evaporates from the surface of fine droplets discharged by spraying in the course of flight, droplets that are kept in the state where dispersion solvent remains in an amount required at least for integrally holding metal nanoparticles, which are the dispersion medium, can come into impact on the surface to be coated. It has been found that as excess of dispersion solvent is rapidly evaporated from the particle surface, the volume percentage which is occupied by metal nanoparticles that are fine dispersion media is increased, and as a result, the viscosity of the concentrated dispersion is rapidly increased.

The present inventors have confirmed that as the state that the viscosity is increased can be achieved at the time point when it comes into impact on a surface to be coated, even though each film thickness coated per application by inkjet is quite thin, they can be repeatedly applied to the same position multi-times so as to increase the total thickness of stacked-up layers being coated; and since the fluidity is greatly decreased at the arrival on the surface to be coated, and thereby crumbling of shape due to run-off or leak-out can be avoided, and for instance, which enable the coating layer to be formed in a pillar-shape having a high aspect ratio in which the height is greater relative to the base. Further, it has also been confirmed that, in the coating layer having such a high aspect ratio, it attains such a condition that metal nanoparticles included therein are closely stacked, and the solvent component remains in a minimum amount that is sufficient just for filling the narrow space left between particles, thereby preventing collapse of the entire shape; and after that, when treatment for sintering is conducted, the minimum amount of solvent component can be promptly removed along with the progress of low temperature sintering. The present inventors have completed the present invention based on these findings.

Hence, the metal nanoparticle dispersion according to the present invention is:

a metal nanoparticle dispersion usable for layered coating by spraying in the form of fine droplets, wherein an average particle size of said metal nanoparticles is selected in the range of 1 to 100 nm;

the metal nanoparticle dispersion is a dispersion comprising said metal nanoparticles uniformly dispersed, as a solid component, in a dispersion solvent;

the surface of the metal nanoparticle is coated with one compound or more which has a group containing a nitrogen, oxygen or sulfur atom and capable of coordinate-bonding by lone pairs existing in these atoms as a group capable of coordinate-bonding to a metal element contained in the metal nanoparticle;

said one or more compounds having the group containing the nitrogen, oxygen or sulfur atom is contained in a total amount of 10 to 50 parts by weight based on 100 parts by weight of said metal nanoparticles;

said dispersion solvent is a type of organic solvent or a mixed solvent of two or more organic liquids, which shows homogeneous liquid state at least at a temperature of 15° C. or higher, wherein the type of organic solvent or at least one of the two or more organic liquids, which composes the dispersion solvent, has affinity for said one compound or more having the group containing the nitrogen, oxygen or sulfur atom;

a fluid viscosity (20° C.) of the dispersion solvent is chosen from 10 mPa·s or lower;

in said metal nanoparticle dispersion, a volume percentage of said dispersion solvent is selected in the range of 55 to 80% by volume, and a fluid viscosity (20° C.) of the metal nanoparticle dispersion is chosen in the range of 2 mPa·s to 30 mPa·s; and a concentrated dispersion that is formed by concentration such that a part of the dispersion solvent contained in said metal nanoparticle dispersion is removed by evaporating so to set a volume percentage of said dispersion solvent in the range of 20 to 50% by volume comes to be a viscous concentrated solution having a fluid viscosity (20° C.) being within the range of 20 Pa·s to 1000 Pa·s.

In such a case, it is preferred that the average particle size of said metal nanoparticles is selected in the range of 1 to 20 nm, and in the metal nanoparticle dispersion, the content of metal nanoparticles is chosen up to 40% by weight or more. For instance, it is preferred that the metal nanoparticle is a metal nanoparticle made of a metal selected from the group consisting of gold, silver, copper, platinum, palladium, tungsten, nickel, tantalum, bismuth, lead, indium, tin, zinc, titanium and aluminum, or a metal nanoparticle composed of an alloy of two or more metals selected from the group of metals.

Among those, more preferred is an embodiment in which said metal nanoparticles are gold nanoparticles, the average particle size of the metal nanoparticles is selected in the range of 1 to 20 nm, and in the metal nanoparticle dispersion, the content of the metal nanoparticles is chosen up to 40% by weight or more; or an embodiment in which said metal nanoparticles are silver nanoparticles, the average particle size of the metal nanoparticles is selected in the range of 1 to 20 nm, and in the metal nanoparticle dispersion, the content of the metal nanoparticles is chosen up to 40% by weight or more.

On the other hand, in the metal nanoparticle dispersion according to the present invention, it is more preferred that as for said one type of the organic solvent or the two or more types of organic liquids that compose the dispersion solvent, at least one of those is an organic solvent of which a melting point is 20° C. or lower and a boiling point is within the range of 80 to 300° C. In particular, said dispersion solvent is preferably a type of organic solvent or a mixed solvent of two or more organic liquids, which has such a high solvency that 50 parts by weight or more of the compound having the group containing the nitrogen, oxygen or sulfur atom, which is used for covering the metal nanoparticle surface, can be dissolved per 100 parts by weight of the dispersion solvent when heated up to 100° C. or higher.

In addition, the present invention also provides various methods of using the metal nanoparticle dispersions, utilizing such a characteristic that the afore-mentioned metal nanoparticle dispersions of the present inventions exhibit, which are applicable to multi-layered coating by jetting in the form of fine droplets;

Typically, the method of using the metal nanoparticle dispersion according to the present invention having the above-described constituents for forming an electroconductive layer is:

a process for forming, on a substrate, an electroconductive layer with good conductivity having a fine shape, which is consisting of a sintered product layer of metal nanoparticles using the metal nanoparticle dispersion, wherein the sintered product layer contains a region in which a layer thickness is set up to 1 μm or more and a ratio of thickness/width of the layer shows a high aspect ratio of 1/4 or higher, the process comprising the steps of:

forming a layered coating film, the thickness of which exceeds the layer thickness of said sintered product layer for the region showing said high aspect ratio by repeating multiple times the treatment of providing a coating layer having coating film thickness set in the range of 0.1 μm each time by discharging said metal nanoparticle dispersion in the form of fine droplets onto the planar pattern of fine shape, and forming a sintered product layer of the metal nanoparticles by carrying out the treatment for baking the metal nanoparticles contained in the layered coating film of the metal nanoparticle dispersion, wherein, in the step of forming said layered coating film, after the metal nanoparticle dispersion is discharged in the form of fine droplets, in the course of the fine droplets coming into impact on the surface to be coated, apart of the dispersion solvent included in the fine droplets is evaporated, whereby concentrated droplets are coated to the surface, the formation of the sintered product layer of metal nanoparticles is conducted by heating the coating layer up to a temperature being not higher than 300° C., and when the heating is carried out for treatment of baking, the compound having the group containing the nitrogen, oxygen or sulfur atom that is used for covering the surface of the metal nanoparticle is separated from the metal nanoparticle surface and dissolved into the dispersion solvent having a high solvency, for which a type of organic solvent or mixed solvent of two or more organic liquids is used, and thereby surface contact of the metal nanoparticles is attained, whereby the metal nanoparticles are sintered with each other and the dispersion solvent is removed by evaporation.

For example, such a process is suitably applicable to cases in which, at least as said region showing a high aspect ratio, a region in which the form of the layer formed on a surface pattern of fine shape is pillar shape is contained in said sintered product layer. In those cases, as for said sintered product layer portion showing a pillar shape, the height of the pillar may be selected in the range of 10 to 100 μm, and the shape of the base may be circular shape whose diameter is chosen in the range of 0.5 to 50 μm.

Alternatively, such a process is suitably applicable to cases in which, at least as said region showing a high aspect ratio, a region in which the form of the layer formed on a surface pattern of fine shape shows a disc-like outer shape, or a conical-socle outer shape as a whole that is constructed of disc-like films having gradually decreased diameters being stacked in order is contained in said sintered product layer. For example, as for said sintered product layer portion showing a disc-like outer shape, the shape of the base may be circular shape whose diameter is chosen in the range of 0.5 to 50 μm.

Further, the process is also suitably applicable to cases in which, at least as said region showing a high aspect ratio, a region exhibiting a buried form that is, as for a through hole connecting the upper layer and the lower layer in a substrate for multilayer interconnection, made by filling up the space of the portion of the through hole from the bottom to the top. For example, in the sintered product layer portion showing said buried form made by filling up the through hole, the opening shape of the through hole may be circular having a diameter selected in the range of 1 to 100 μm. The process is also applicable to cases in which the opening shape of the through hole is circular having a diameter chosen in the range of 1 to 500 μm. The process is preferably applicable to cases of the opening of the through hole being circular having a diameter chosen in the range of 5 to 500 μm, and more preferably in the range of 20 to 200 μm.

Furthermore, in the method of using the metal nanoparticle dispersion according to the present invention for forming an electroconductive layer, it is preferred that, in the step of forming the layered coating film by discharging said metal nanoparticle dispersion in the form of fine droplets, the method of discharging said metal nanoparticle dispersion in the form of fine droplets is selected from deposition or inkjet. On the other hand, it is preferred that the heat-treatment temperature used for forming the sintered product layer of metal nanoparticles is chosen in the range of 150° C. to 300° C.

For example, when the heat-treatment temperature upon forming a sintered product layer is set in the aforementioned range, said metal nanoparticles to be contained in said metal nanoparticle dispersion are nanoparticles made of a metal selected from the group consisting of gold, silver, copper, platinum and palladium. In particular, it is more preferred that the metal nanoparticles are gold or silver nanoparticles, and the average particle size of the metal nanoparticles is selected in the range of 1 to 20 nm.

In addition, the present invention also provides a method of using the metal nanoparticle dispersion according to the present invention for fabricating various wiring substrates:

A first aspect thereof is a process for preparing a wiring substrate by forming an electroconductive layer with good conductivity having a fine pattern, which is composed of a sintered product layer of metal nanoparticles on the substrate, with use of the metal nanoparticle dispersion of the present invention having the above-described constituents, wherein said wiring substrate is provided with a conductive pillar that is used for electrical connection with an upper layer when mounting a chip part at a predetermined position thereof, and after mounting the chip part thereon, an encapsulating resin layer for covering a chip part mounted surface is formed thereon to make a chip part mounted board equipped with an encapsulating resin layer up, the process for fabricating the chip part mounted board comprises the steps of:

forming the conductive pillar in the form of a sintered product layer showing a pillar shape by the above-described process for forming an electroconductive layer having a pillar shape, mounting said chip part on the wiring substrate provided with said conductive pillar, and forming the encapsulating resin layer for covering the mounted surface including the chip part mounted thereon.

A second aspect thereof is a process for preparing a wiring substrate by forming an electroconductive layer with good conductivity having a fine pattern, which is composed of a sintered product layer of metal nanoparticles on the substrate, with use of the metal nanoparticle dispersion of the present invention having the above-described constituents, wherein the wiring substrate has further an upper layer circuit wiring pattern provided on the encapsulating resin layer of the chip part mounted board that is fabricated by the aforementioned process for fabricating a chip part mounted board, and after mounting another chip part on said upper layer circuit wiring pattern, an encapsulating resin layer for covering a chip part mounted surface is formed thereon to make a chip part mounted multilayer board equipped with an encapsulating resin layer up, the process for fabricating the chip part mounted multilayer board comprises the steps of:

mounting a chip part on a lower layer circuit wiring pattern, and then forming an encapsulating resin layer for covering the mounted surface by means of the aforementioned process of fabricating a chip part mounted board, forming an upper layer circuit wiring pattern on the surface of said encapsulating resin layer provided on the chip part mounted board, mounting another chip part on said upper layer circuit wiring pattern, and forming an encapsulating resin layer for covering the mounted surface including the chip part mounted thereon, wherein a conductive pillar for electrical connection with the upper layer is employed as at least one of electrical connections between the lower layer and the upper layer.

A third aspect thereof is a process for preparing a wiring substrate by forming an electroconductive layer with good conductivity having a fine pattern, which is composed of a sintered product layer of metal nanoparticles on the substrate, with use of the metal nanoparticle dispersion of the present invention having the above-described constituents, wherein the wiring substrate is provided with a bump used for electrical connection with a chip part when mounting the chip part at a predetermined position thereof, and an electrode for the chip part is aligned on the bump, and then the chip part is mounted thereon to make a chip part mounted board up, the process for fabricating the chip part mounted board comprises the steps of:

forming said bump in the form of a sintered product layer having a disc-like (or conical socle-like) shape by means of the above-described process for forming an electroconductive layer having a disc-like (or conical socle-like) outer shape, and mounting the chip part on the wiring substrate provided with said disc-like (or conical socle-like) bump.

A fourth aspect thereof is a process for preparing a wiring substrate by forming an electroconductive layer with good conductivity having a fine pattern, which is composed of a sintered product layer of metal nanoparticles on the substrate, with use of the metal nanoparticle dispersion of the present invention having the above-described constituents, wherein the wiring substrate is provided with at least two circuit wiring layers that are formed on a surface of a substrate for each layer and a through hole piercing through the substrate for the upper layer, and a buried electroconductive layer is formed at least in the through hole used for an electrical connection path between the upper layer and the lower layer to make a multilayer wiring substrate utilizing via hole connection up, the process for fabricating the multilayer wiring substrate comprises a step of:

forming an electroconductive layer buried in a through hole, which is used for said via hole connection, by means of the above-described process for forming an electroconductive layer buried in a through hole.

When the metal nanoparticle dispersion of the present invention is used, for example, coated films in which metal nanoparticles are closely stacked with each other can be piled up in the form of multi-layered coating layer having such pillar shape that its base area is small but its height is large, by using coating technique capable of jetting it in the form of fine droplets to apply on the targeted very small region, such as deposition or inkjet; and then the treatment for low temperature sintering can be successfully conducted to construct a pillar made of a metal sintered product that extends in the longitudinal direction. In other words, by using the metal nanoparticle dispersion according to the present invention, a fine sintered product layer of metal nanoparticles showing such a aspect ratio that the sintered product layer has a fine surface pattern and a relatively large film thickness can be prepared simply with high shape controllability and reproducibility by employing such a coating method by inkjet. In addition, by using the metal nanoparticle dispersion according to the present invention, the specific resistivity of the prepared sintered product layer can be brought to a preferable range of $10 \times 10^{-6}$ Ω·cm or smaller, and the sintered product layer is suitably used for forming a fine wiring pattern with low impedance.

BEST MODE FOR CARRYING OUT THE INVENTION

Figure 1:
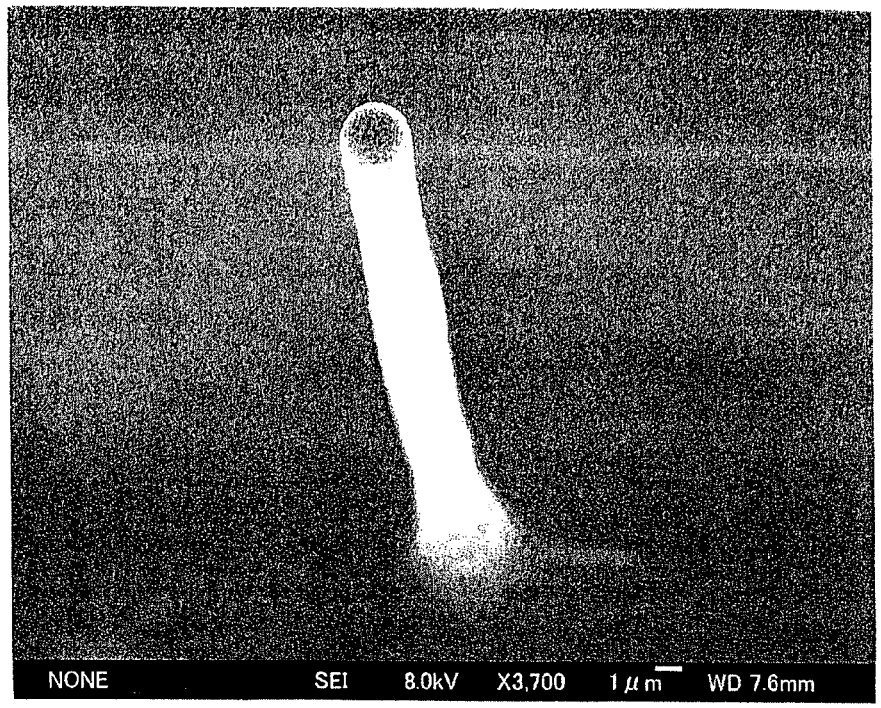
FIG. 1 is a print out of an image of an outer shape of a pillar-shaped metal pillar composed of the sintered product layer of silver nanoparticles as explained in Example 1, which is observed by a microscope (SEM)

The present inventors have found that properties of a metal nanoparticle dispersion are greatly changed by changing the kind or amount of metal nanoparticles, coating agent and solvent, which are components of the dispersion. In particular, it has been confirmed that the content of the dispersion solvent significantly affects the fluid viscosity of the dispersion. From these facts, it has been found that after a metal nanoparticle dispersion composed of specific components is jetted in the form of fine droplets, in the course of flight to deposit on the target, dispersion solvent contained in the droplets is evaporated, and thereby the viscosity of the concentrated solution is rapidly increased, so that even a coating layer having, for example, a pillar shape structure can be formed therewith.

Specifically, upon jetting a metal nanoparticle dispersion to a substrate in the form of fine droplets, evaporation of the contained dispersion solvent is accelatered when the average particle size of the droplets is adjusted at least to 3 μm or smaller, and the amount of the dispersion solvent remaining in the droplets of the metal nanoparticle dispersion is significantly reduced at the time point of impact, and along with this, the fluidity is greatly reduced. Thus, because the discharged droplets of the metal nanoparticle dispersion are small, and also the fluidity of the metal nanoparticle dispersion in the droplet coming into impact is lowered, the diameter of the dot coated with the metal nanoparticles formed per droplet is as very small as 0.5 to 5 µm. After that, most of the remaining dispersion solvent also instantly evaporates because individual films of coated dots are thin, and thus closely stacked metal nanoparticles are attached upon a substrate as a highly viscous lump in which dispersion solvent is infiltrated only in a narrow space between particles. By repeating this dot application step, the coated films of metal nanoparticles having a diameter of a coated dot can be stacked up to form a thick layer on a substrate. When coating layers of such metal nanoparticles having an extremely small area are accumulated up in the longitudinal direction by continuing the discharge of the dispersion, a pillar structure having a height of 10 to 100 µm that is made up of metal nanoparticle coating layers is finally built up. Then, by sintering the pillar structure made of accumulated metal nanoparticles at a low temperature, the molecular covering layer on the metal nanoparticle surface and the dispersion solvent infiltrated in the space between particles are removed, and thereby metal nanoparticles are fused with each other to form a pillar-shaped metal sintered product layer. The thus-formed pillar of sintered metal product has a high metal content and a closely packed structure, and so it shows a specific resistivity close to that of the metal as is.

When metal nanoparticle dispersion is coated by jetting in the form of fine droplets to form a stacked coating layer showing a high aspect ratio based on the above-described mechanism, it is preferred that the rapid change in the fluid viscosity of the dispersion is induced by the change in the volume content of the dispersion solvent, and also the average particle size is selected in a smaller range. Specifically, the average particle size of metal nanoparticles is more preferably chosen in the range of 1 to 20 nm. Further, it is preferred that the content of metal nanoparticles contained in the initial metal nanoparticle dispersion is chosen at 40% by weight or more, and in relative, the volume content of the dispersion solvent is set to the lowest possible level, by which high fluidity necessary for jetting it in the form of fine droplets can be achieved. On the other hand, when the volume content of the dispersion solvent contained in the initial metal nanoparticle dispersion is set high, in the course of coming into impact after the ejection, evaporation of the solvent does not proceed to the intended level, and so at the time point of impact, the metal nanoparticle dispersion still shows a considerable fluidity. As a result, formation of, for example, a pillar structure by using a metal nanoparticle coating layer is difficult.

In the following, the present invention is explained in more detail.

The metal nanoparticle dispersion of the present invention is usable for ultra-fine printing that is applicable to forming low impedance, extremely fine circuit patterns adapted to high density digital wiring. Specifically, the dispersion is suitably used for such a purpose of forming, with use of a sintered product layer of the metal nanoparticles, an electro-conductive layer with a fine surface pattern exhibiting a high aspect ratio, for instance, a conductive wiring layer having such a high thickness/minimum width ratio that its thickness is more than 10 µm and its minimum line width is less than 10 µm; a fine column-shaped conductive pillar having a diameter of several µm and a height of several 10 µm; a conductive bump having a disc-like (or conical socle) outer shape of which the base has a diameter of several ?m; and via hole connection by a through hole having an opening diameter of several µm. Accordingly, in order to draw said fine surface pattern at high accuracy, the average particle size of the metal nanoparticles contained therein is selected in the range of 1 to 100 nm, depending on the line width or the dimension of the surface shape of the intended ultra-fine printing. The average particle size thereof is preferably chosen in the range of 1 to 20 nm. By setting the average particle size of the metal nanoparticles contained therein within the aforementioned range, the dispersion can be coated to patterns with an extremely narrow line width by a known method such as inkjet printing.

Thus, when such extremely fine metal nanoparticles are used, particles are aggregated upon contact with each other if they are in the form of dry powder, and such aggregate is not suitable for high density printing intended in the present invention. To avoid the aggregation of nanoparticles, preferably used is such dispersion that the surface of the metal nanoparticles is in advance coated with a low molecular substance, and then they are kept in the dispersed state in liquid. In other words, for the metal nanoparticle dispersion of the present invention, such a metal nanoparticle that is kept in such a state that substantially no oxide film is present on its surface is employed, and whereby a thick coating layer that is formed by multi-layered coating is heat-treated to induce fusion of metal nanoparticles contained in the layer at the interface.

Specifically, as for the metal nanoparticles used as a raw material, the surface thereof is coated with one compound or more which has a group containing a nitrogen, oxygen or sulfur atom and capable of coordinate-bonding by lone pairs existing in these atoms as a group capable of coordinate-bonding to a metal element contained in the metal nanoparticle. More specifically, a metal nanoparticle dispersion is used in which the metal nanoparticles are dispersed in one or more organic solvents in such a state that the surface of the metal nanoparticles is uniformly covered with one compound or more which has a group containing a nitrogen, oxygen or sulfur atom as a group capable of coordinate-bonding to a metal element contained in the metal nanoparticle, for example, they are kept in such a state that the surface is covered with such a compound as an amine compound containing 1 or more terminal amino group.

The function of the covering layer is that it avoids aggregation of metal nanoparticles in the dispersion by keeping the surface of the metal nanoparticles from contacting with each other before heating, thereby maintaining high anti-aggregation properties during storage. Also, even if the particles come into contact with water or oxygen molecules in air upon coating, as the surface of the metal nanoparticle is in advance covered with the covering layer, the surface is free from direct contact with water molecules or oxygen molecules. Thus, the covering layer also has a function of preventing formation of natural oxide on the surface of the ultrafine metal particles due to water or oxygen molecules in air.

The compound used for uniformly covering the surface of metal nanoparticles utilizes a group having a lone pair on a nitrogen, an oxygen or a sulfur atom to form a coordinative bond with a metal element. Examples of groups containing a nitrogen atom include an amino group. Examples of groups containing a sulfur atom include a sulfanyl group (—SH) and a sulfide-type sulfane-di-yl group (—S—). Examples of groups having an oxygen atom include a hydroxyl group (—OH) and an ether-type oxy group (—O—).

Typical examples of usable compounds having an amino group include alkylamine. Among the alkylamine, suitable is one that does not come off in a normal storage environment, more specifically, at a temperature lower than 40° C., once it comes into the state of forming a coordinate bond to a metal element, and thus an alkylamine having a boiling point in the range of 60° C. or higher, preferably of 100° C. or higher, more preferably of 150° C. or higher is suitable. On the other hand, since the alkylamine must come off from the surfaces of the metal nanoparticles, and then be evaporated with a dispersion solvent in final when the heat treatment of the conductive nanoparticle paste is carried out, it is preferred that a boiling point of the alkylamine is selected at least from a range of not higher than 300° C., generally from a range of not higher than 250° C. For example, as to the alkylamine above-mentioned, such an alkylamine with alkyl group being selected from a range of $C_8$ to $C_{18}$, and having an amino group at terminals of its alkyl chain are usable. For example, since said alkylamine selected from a range of $C_8$ to $C_{18}$ has thermal stability and its vapor pressure at room temperature or the like is not so high, it is also easy to keep and control its content within a desired range during storage at room temperature or the like, and therefore such an alkylamine is suitably used due to its ease of handling.

In general, a primary amine type compound is preferred in forming the coordinate bond since it exhibits a higher bonding capability, while compounds of secondary and tertiary amine type may also be used. Further, compounds having two or more adjacent amino groups that are involved in their bonding, such as 1,2- and 1,3-diamine type compounds, may also be used. Generally, to form such coordinative bond, primary amine compounds are more preferred because of their higher binding capacities, but secondary amine and tertiary amine compounds may also be used. Amine compounds in which two or more adjacent amino groups are involved in bonding, such as a 1,2-diamine or 1,3-diamine compound, are also useful. In addition, polyamine compounds having such a relatively small molecular weight that they can be dissolved in a dispersion solvent may be used. In some cases, a linear amine compound having ethereal oxy groups (—O—) in its chain, such as a polyoxyalkyleneamine, may be used. Furthermore, in addition to the terminal amino group, a compound further having a hydrophilic terminal group, for example a hydroxylamine having a hydroxyl group such as ethanolamine, can also be used.

On the other hand, typical examples of usable compounds having a sulfanyl group (—SH) include an alkanethiol. Among the alkanethiols, suitable is one that does not come off in a normal storage environment, more specifically, at a temperature lower than 40° C., once it comes into the state of forming a coordinate bond to a metal element, and thus an alkanethiol having a boiling point in the range of 60° C. or higher, preferably of 100° C. or higher, more preferably in the range of 150° C. or higher is appropriate. However, since the alkanethiol must come off from the surfaces of the metal nanoparticles, and then be evaporated with a dispersion solvent in final when the heat treatment of the conductive nanoparticle paste is carried out, it is preferred that a boiling point of the alkanethiol is selected at least from a range of not higher than 300° C., generally from a range of not higher than 250° C. For example, as to the alkanethiol above-mentioned, a $C_4$ to $C_{20}$ alkyl group is usable, more preferably selected from a range of $C_8$ to $C_{18}$, and those having a sulfanyl group (—SH) at terminals of their alkyl chain are usable. For example, since said alkanethiol selected from a range of $C_8$ to $C_{18}$ has thermal stability and its vapor pressure is not so high, it is also easy to keep and control its content within a desired range during storage at room temperature or the like, and therefore such an alkanethiol is suitably used due to its ease of handling. In general, a primary thiol type compound is preferred in forming the coordinate bond since it exhibits a higher bonding capability, while compounds of secondary and tertiary thiol type may also be used. Further, compounds having two or more sulfanyl groups (—SH) that are involved in their bonding, such as 1,2-dithiol type compounds, may also be used. In addition, polythioether compounds having such a relatively small molecular weight that they can be dissolved in a dispersion solvent may be used.

Further, typical examples of usable compounds having a hydroxyl group include an alkanediol. Examples of the alkanediol include glycols such as ethylene glycol, diethylene glycol and a polyethylene glycol. In addition, polyether compounds having such a relatively small molecular weight that they can be dissolved in a dispersion solvent may be used. Among the alkanediols, suitable is one that does not come off in a normal storage environment, more specifically, at a temperature lower than 40° C., once it comes into the state of forming a coordinate bond to a metal element, and thus an alkanediol having a boiling point in the range of 60° C. or higher, preferably of 100° C. or higher, more preferably in the range of 150° C. or higher is preferable. However, since the alkanediol must come off from the surfaces of the metal nanoparticles, and then be evaporated with a dispersion solvent in final when the heat treatment of the conductive nanoparticle paste is carried out, it is preferred that a boiling point of the alkanediol is selected at least from a range of not higher than 300° C., generally from a range of not higher than 250° C. For instance, compounds having two or more hydroxy groups that are involved in their bonding, such as 1,2-diol type compounds, may be more preferably used.

Regarding to the metal nanoparticles used in the dispersion of the present invention, the metal nanoparticles contained therein are dispersed in a dispersion solvent in such a state that they contain, as a surface covering layer, one or more compounds which has aforementioned group containing a nitrogen, oxygen or sulfur atom and capable of coordinate-bonding by lone pairs existing in these atoms. For this surface covering layer, an appropriate covering ratio is selected so as to avoid an excessive supply of covering molecules within the range that the layer can fulfill the function of preventing direct contact of the surfaces of metal nanoparticles during storage. Specifically, the covering ratio is adjusted, within the range in which the covering and protecting functions are achieved, to an appropriate content at which the covering molecules can be dissolved and separated into the coexistent dispersion solvent upon heating and low temperature sintering. For example, the covering ratio is set so that when a conductive metal nanoparticle paste is prepared, the paste contains generally 10 to 50 parts by weight, more preferably 20 to 50 parts by weight in total of the one or more compounds which has aforementioned group containing a nitrogen, oxygen or sulfur atom and capable of coordinate-bonding by lone pairs existing in these atoms, based on 100 parts by weight of the metal nanoparticles. The total amount, based on 100 parts by weight of the metal nanoparticles, of one or more compounds having the aforementioned group containing a nitrogen, oxygen or sulfur atom and capable of coordinate-bonding by lone pairs existing in these atoms, which is required for covering the surface, also depends on the average particle size of the metal nanoparticles. Specifically, the smaller the average particle size of the metal nanoparticle, the greater the sum of the surface areas of the metal nanoparticle per 100 parts by weight thereof in inverse proportion to the average particle size, and thus the total proportion of the covering molecules must be high. In view of this, when the average particle size of metal nanoparticles is selected in the range of 1 to 20 nm, the total covering molecules covering the surface is preferably chosen in the range of 20 to 50 parts by weight based on 100 parts by weight of the metal nanoparticles.

An organic solvent used as a dispersion solvent contained in the metal nanoparticle dispersion of the present invention has a role of dispersing metal nanoparticles having the above-described surface covering layer at room temperature, and functions as a solvent capable of eluting and separating covering layer molecules on the metal nanoparticle surface upon heating. In this case, a high boiling point organic liquid which is not evaporated too much in the stage of elution of covering layer molecules under heating is to be used. Accordingly, an organic solvent or mixed solvent of two or more organic liquids having such a high solvency that is capable of dissolving, when heated up to 100° C. or higher, preferably 50parts by weight or more of the aforementioned compound having a group containing a nitrogen, oxygen or sulfur atom that covers the metal nanoparticle surface, based on 100 parts by weight of the dispersion solvent, is used. An organic solvent or mixed solvent of two or more organic liquids capable of forming, when heated to 100° C. or higher, a mixture of any composition with the compound having a group containing a nitrogen, oxygen or sulfur atom that covers the metal nanoparticle surface, in particular, those having a high compatibility, are more preferably used.

To put it specifically, when a covering layer molecule is coordinated to the metal nanoparticle surface with use of a group having a nitrogen, oxygen or sulfur atom and capable of forming a coordinative bond via a lone pair existing on those atoms, the organic solvent contained in the dispersion solvent functions to maintain the dispersion state of metal nanoparticles covered with covering layer molecules, or to make them compatible with each other, utilizing the affinity for the existing hydrocarbon chain and main chain portion of the coating molecules. Although the chemical attraction of covering layer molecules that is originated from coordinative bonding to the metal nanoparticle surface is stronger than physical adsorption, the affinity rapidly decreases by heating. On the other hand, dissolving properties which the organic solvent shows increases along with temperature rise. As the result, when heated to a temperature higher than the temperature at which said two processes are balanced, elution and separation of covering layer molecules are accelerated along with temperature rise. Finally, substantially all covering layer molecules on the metal nanoparticle surface are dissolved in the existing dispersion solvent during heating, and substantially no covering layer molecule remains on the metal nanoparticle surface.

The elution process of covering layer molecules from the metal nanoparticle surface and reattachment process thereof are, of course, in a thermally equilibrium relation, and so it is desired that the solubility of the covering layer molecule in the dispersion solvent upon heating is sufficiently high. Even if covering layer molecules are once dissolved into the dispersion solvent filled in the space between metal nanoparticles, it takes an additional time for the covering layer molecules to diffuse and flow out into from the inside of the coating layer to the outer region through the narrow space. For effective prevention of reattachment of covering layer molecules during progress of sintering of metal nanoparticles, the above-described organic solvent having a high solvency is preferably used.

Accordingly, the organic solvent that is suitably used as a dispersion solvent is one which can not dissolve easily the covering layer molecules on the metal nanoparticle surface at about room temperature despite its affinity for the covering layer molecules on the metal nanoparticle surface, but can dissolve the covering layer molecules upon heating up to 100°C. or more as their solubility is increased by heating. For a compound forming a covering layer on the metal nanoparticle surface, e.g., amine compounds such as alkylamine, a solvent which contains a linear hydrocarbon group having an affinity for the alkyl group of the compound is selected, but instead of those having high polarity causing disappearance of the covering layer on the metal nanoparticle surface even at about room temperature due to good dissolution of the amine compound, a non-polar or a low polarity solvent is preferably selected. Further, it is preferred that the organic solvent has such thermal stability that thermal decomposition is not caused at a temperature of low temperature sintering when the conductive metal nanoparticle paste of the present invention is practically used. It is preferred that the organic solvent has a boiling point of at least 80°C. or higher, preferably in the range of 150°C. or higher, but lower than 300°C. In addition, when forming narrow lines, the fluid viscosity of the conductive metal nanoparticle paste must be maintained at the desired level in the application step, and therefore, in view of handling properties, the aforementioned non-polar or low polarity solvent which has a high boiling point and hardly evaporates at about room temperature is preferably used. For example, alkanes having 10 or more carbon atoms such as tetradecane and primary alcohols having 10 or more carbon atoms such as 1-decabol are preferably used. Note, however, that it is desired to select a solvent so that the fluid viscosity of the whole dispersion solvent used is at least 10 mPa·s (20° C.) or lower, preferably within the range of 0.2 to 3 mPa·s (20° C.).

The metal nanoparticle dispersion of the present invention is used for drawing of fine pattern using various methods in which the dispersion is coated in the form of fine droplets by spraying, e.g., deposition or inkjet. Accordingly, it is necessary to prepare a metal nanoparticle dispersion of the present invention having a fluid viscosity appropriate for the employed drawing method. For instance, when inkjet is employed for drawing fine wiring pattern, it is desired that the fluid viscosity of the dispersion containing nanoparticles is chosen in the range of 2 to 30 mPa·s (20° C.). In that case, the volume percentage of the dispersion solvent in the paste is preferably selected in the range of 55 to 80% by volume. On the other hand, when fine droplets fly and come into impact on the surface to be coated after being discharged by inkjet, the fluid viscosity is preferably increased to 20 Pa·s to 1000 Pa·s (20° C.) due to concentration by evaporation of a part of the dispersion solvent from the fine droplets. At this stage, the volume percentage of the dispersion solvent in the concentrated dispersion is more preferably lowered in the range of 20 to 50% by volume. The fluid viscosity of the dispersion containing nanoparticles can be varied in dependence on the average particle size and dispersion concentration of the nanoparticles used, and the kind of dispersion solvents used. The fluid viscosity can be adjusted to the intended level by appropriate choice of said three factors.

Specifically, it is preferred that the composition of the metal nanoparticle dispersion according to the present invention may be designed so that the fluid viscosity is 2 to 30 mPa·s (20° C.) when the volume percentage of the dispersion solvent in the paste is selected in the range of 55 to 80% by volume, but when the amount of the dispersion solvent added is reduced to prepare a corresponding concentrated dispersion having a volume percentage of a dispersion solvent set in the range of 20 to 50% by volume, the viscosity of the concentrated dispersion is heightened in the range of 20 Pa·s to 1000 Pa·s (20° C.).

In addition to the above-described non-polar or low polarity solvent showing a high boiling point, a relatively low polarity organic liquid may be added as a dispersion solvent, which can control the fluid viscosity, contribute to elution of covering layer molecules upon heating and prevent separation of covering layer molecules at about room temperature, and further has a function of compensation for the separation. It is desired that such low polarity organic liquid added as a supplementary solvent component can be homogeneously mixed with main solvent components and has a boiling point as high as that of the main solvent. For example, when the main solvent component is primary alcohol having 10 or more carbon atoms such as 1-decanol, branched diol such as 2-ethyl-1,3-hexanediol may be employed as the low polarity organic liquid to be blended additionally. When the main solvent component is alkane having 10 or more carbon atoms such as tetradecane, dialkylamine having a branched chain such as bis-2-ethylhexylamine may be used.

Since the metal nanoparticle dispersion according to the present invention contains no binder resin component such as thermosetting epoxy resin which is polymerized and cured upon heating or acid anhydride reactive with covering molecules, no polymer is produced in the dispersion even in the low temperature sintering step, excluding the factor of significant reduction of the fluidity of the dispersion solvent.

Upon heating, covering layer molecules covering the metal nanoparticle surface such as alkylamine are dissolved and separated into the above-described dispersion solvent, then the covering layer that has prevented aggregation of metal nanoparticles disappears, and metal nanoparticles are gradually fused and integrated with each other and finally a random chain is formed. In these steps, with the progress of low temperature sintering of metal nanoparticles, spaces between nanoparticles are reduced resulting in volume shrinkage of the entire body, and random chains are closely contacted with each other. When spaces between nanoparticles are reduced, the dispersion solvent filling the spaces still maintains its fluidity and thus can be discharged to the outside even if the spaces between nanoparticles are narrowed, advancing volume shrinkage of the entire body. When the heat-treatment temperature in this low temperature sintering process is set in the range of 300° C. or lower, preferably of 250° C. or lower, the covering layer molecules are dissolved and separated into the above-described dispersion solvent, and the obtained sintered product of metal nanoparticles forms an electroconductive layer which has a smooth profile without surface roughness reflecting non-uniform aggregation of metal nanoparticles and is more closely packed and has an extremely low resistance, e.g., a specific resistivity of $10 \times 10^{-6}$ $\Omega \cdot$cm or lower. On the other hand, the dispersion solvent discharged to the outside upon volume shrinkage of the entire body and covering layer molecules dissolved therein are gradually evaporated during continuation of heating, and so the content of organic substances remaining in the sintered product of metal nanoparticles finally obtained is extremely small. More specifically, since the dispersion does not contain a thermosetting resin component or the like which remains in the sintered product of metal nanoparticles after the low temperature sintering step and constitutes an electroconductive layer as a binder resin, the volume percentage of the sintered product of metal nanoparticles in the electroconductive layer is high. As a result, not only the metal nanoparticle sintered product has a low specific resistivity, but also the electroconductive layer has a vastly superior thermal conductivity due to the high volume percentage of the metal body. Due to such dual advantages, formation of minute sintered product layers using the metal nanoparticle dispersion of the present invention is more suitably coated to formation of fine wiring pattern through which current flows at high density.

In the method of forming fine wiring pattern of the present invention, a thick stacked layer is formed on the intended fine pattern using the above-described metal nanoparticle dispersion whose fluid viscosity is appropriately adjusted based on the application method. To draw a fine pattern at high reproducibility and high drawing accuracy, it is preferable to apply inkjet printing. Regardless of using inkjet or deposition, the average thickness of the dispersion coating layer to be formed is chosen at at least 1/2 or more, usually in the range of 1/1 to 20/1 of the minimum line width of the fine pattern to be formed. Accordingly, it is more reasonable to select the average film thickness of the finally obtained close-packed sintered metal layer in the range of 1/4 to 10/1 of the minimum line width of the fine pattern in view of aggregation and shrinkage due to evaporation and sintering of the dispersion solvent in the coating layer. In relation to this requirement, it is desired that the content of the dispersion solvent remaining in the metal nanoparticle coating layer that is multi-layer coated by inkjet printing is preferably concentrated to the range of the volume percentage of the dispersion solvent described above.

On the other hand, fine-patterned sintered product layers thus prepared, which are used as conductive member for mounting various electronic parts on a printed wiring substrate, preferably comprises any one of gold, silver, copper, platinum, palladium, tungsten, nickel, tantalum, bismuth, lead, indium, tin, zinc, titanium and aluminum. Alternatively, an alloy of two or more metals selected from the aforementioned group may be used. Thus, the metal nanoparticle used for the conductive metal nanoparticle paste according to the present invention is desirably formed a metal or an alloy of two or more metals, selected from a group consisting of gold, silver, copper, platinum, palladium, tungsten, nickel, tantalum, bismuth, lead, indium, tin, zinc, titanium or aluminum depending on intended applications.

Further, a metal for the metal nanoparticles is selected so that it has a melting point higher than the heat-treatment temperature in the low temperature sintering step described below. Specifically, a selected condition is that sintering of metal nanoparticles advances but melting does not occur in the low temperature sintering step. In the case of using nanoparticles composed of two or more kinds of metals as well, the alloy must have a boiling point higher than the heat-treatment temperature in the low temperature sintering step described below. Thus, it is preferable to set the composition of an alloy material constituting nanoparticles composed of two or more kinds of metals so that the melting point of the alloy is set at least 20° C. or more higher than the heat-treatment temperature in the low temperature sintering step. More specifically, it is more preferable to select the composition of the used alloy material so that the melting point of the alloy is adjusted at least 200° C. or higher, usually in the range of 250° C. or higher, e.g., higher than 300° C.

In addition, as indium has a melting point of 156.6° C., the metal is preferably made into an alloy with other metal and used in the form of indium alloy nanoparticles having a melting point of 250° C. or higher. On the other hand, in the case of tungsten, tantalum and titanium, progress of low temperature sintering is much slower than that of other metal species, and thus the heat-treatment temperature required in low temperature sintering may be lowered by making the average particle size smaller. Preferred are an embodiment in which a sintered product of a whole mixture of nanoparticles of tungsten, tantalum or titanium and nanoparticles of other metal species is formed, and an embodiment in which tungsten, tantalum or titanium is made into an alloy with other metal and a sintered product of nanoparticles of the tungsten, tantalum or titanium-containing alloy is formed.

In its application to conductive members in the form of a metal bump described later, any one of gold, silver, copper, platinum and palladium having high conductivity and excellent ductibility and malleability is preferably selected as a metal species constituting metal nanoparticles. Of these, gold nanoparticles and silver nanoparticles are more preferably used. In the case of using gold nanoparticles or silver nanoparticles as well, it is desired that the average particle size of the metal nanoparticles is selected in the range of 1 to 20 nm and the content of the metal nanoparticle in the initial metal nanoparticle dispersion is chosen from 40% by weight or more.

The metal nanoparticles described immediately above can be formed into a good sintered product as long as the metal surface is kept clean even if the heat-treatment temperature in the low temperature sintering step is chosen in the range of 300° C. or lower, preferably of 250° C. or lower. Further, these metal nanoparticles are easily fused and aggregated with each other even at about room temperature when the metal surfaces are brought into direct contact. Therefore, when the conductive metal nanoparticle paste of the present invention is prepared by using a commercially available metal nanoparticle dispersion as a raw material and changing the dispersion solvent to the desired organic solvent, and further adjusting the content and the fluid viscosity of the dispersion solvent to appropriate values, it is desired to follow the procedures described below.

As a metal nanoparticle dispersion used as a raw material, useful is a dispersion in which metal nanoparticles covered with surface covering molecules such as alkylamine are uniformly dispersed in a non-polar or low polarity solvent which can be removed and has a low dissolving power for surface covering molecules such as alkylamine, preferably a non-polar or low polarity solvent having a boiling point of 150°C. or lower. First, with suppressing detachment of surface covering molecules such as alkylamine, the dispersion solvent contained in the metal nanoparticle dispersion is removed. It is appropriate to remove the dispersion solvent under reduced pressure, and to prevent surface covering molecules detaching from the metal nanoparticle surface during the removal under reduced pressure, such removal may be performed after adding and mixing, if necessary, a solvent component for protection having a higher affinity for the covering layer molecules and a boiling point significantly higher than that of the dispersion solvent to be removed. For instance, when the dispersion solvent to be removed under reduced pressure is toluene, and alkylamine, e.g., dodecylamine, is used as a covering layer molecule for metal nanoparticles, a small amount of a diol solvent including glycols such as dipropylene glycol, diethylene glycol, propylene glycol and ethylene glycol may be added as the aforementioned protective solvent. In addition, instead of alkylamine such as dodecylamine used as a covering layer molecule for metal nanoparticles, another amine having a high boiling point useful as a covering layer molecule for metal nanoparticles may be added. Such amine may be used for substituting a part of the covering layer molecules for metal nanoparticles initially present when the dispersion solvent is removed under reduced pressure. As a covering layer molecule component for substitution such as another amine, a high boiling point liquid organic compound having compatibility with the protective solvent component such as glycol and also containing a group capable of forming a coordination bond such as an amino group may be used. For example, 2-ethylhexylamine and JEFFAMINE™ EDR148 (2,2-(ethylenedioxy)bisethylamine) can be used.

In the process of preparing the metal nanoparticle dispersion of the present invention, bulk of metal nanoparticles aggregated due to fall off of the covering layer may also be present in addition to metal nanoparticles having a covering layer on the surface when the dispersion solvent is changed to the above-described high boiling point non-polar or low polarity solvent and particles are re-dispersed. Thus, it is desired that the finely dispersed re-dispersed solution is filtrated through a filter having a diameter of a submicron size, e.g., 0.2 μm membrane filter, to remove the aggregated metal nanoparticles. By this filtration, the intended high fluidity dispersion in which metal nanoparticles having a covering layer on the surface are uniformly dispersed in a high boiling point dispersion solvent can be prepared with higher reliability.

As described above, by using the metal nanoparticle dispersion of the present invention, a pillar-shaped sintered metal layer several 10 μm in height can be formed on a substrate. After mounting chip parts on the substrate, the chip parts are encapsulated by resin, exposing the tip of the pillar-shaped sintered metal layer as conducting portion on the resin encapsulation layer. In other words, a chip mounted substrate provided with a conducting terminal for connection with a lower circuit wiring layer on a resin encapsulation layer can be fabricated. As the encapsulating resin used for this, thermosetting resins are preferred, and an epoxy resin, a phenol resin or an acrylic resin may be used. A multilayer board can be prepared by forming another circuit wiring pattern on such resin encapsulation layer. In that case, the upper layer circuit wiring pattern may be formed by using general metal fine particle paste according to screen printing, inkjet or a transfer method. For the metal fine particle paste for upper layer circuit wiring pattern, it is preferable to use a metal material which is the same as that constituting the pillar-shaped sintered metal layer used for an interlayer conducting portion. However, paste of another kind of metal fine particles may also be used. The viscosity and other properties of the metal fine particle paste for forming an upper layer circuit wiring pattern are set to levels appropriate for forming the intended wiring pattern.

On the other hand, by preparing a sintered product layer having a disc-like (or conical socle) outer shape using the metal nanoparticle dispersion of the present invention, a disc-like (or conical) metal bump can be formed at any position in any size. Due to fusion of metal nanoparticles in low temperature sintering, such metal bump can also be formed into a bump with size of 0.5 to 50 μm in the diameter of its base. The obtained metal nanoparticle sintered product can form a bump having low resistance close to the specific resistivity of the metal in bulk. Accordingly, a minute chip mounted board can be fabricated by mounting minute chips on this bump.

In the field of electronic appliances, the mainstream of used wiring substrates is multilayer wiring substrates. For interlayer conduction in these multilayer wiring substrates, via hole connection is widely used as a general method, in which conducting paths are formed by creating through holes piercing through board materials of each layer and filling the through holes with a conductive material. In the case of conventional conductive metal paste, the contained metal filler has a large particle size, and therefore the conductive metal paste cannot be poured into through holes unless the through holes has an appropriately large diameter.

On the contrary, when the metal nanoparticle dispersion of the present invention is used, a close-packed coating layer can be formed inside a through hole of which the diameter of the opening is set in the range of 1 to 500 µm. By subjecting the layer to sintering at a low temperature after filling, a sintered metal layer having a good conductivity of 1×10$^{-5}$ Ω·cm or lower which is comparable to the specific resistivity of the bulk metal can be formed within a through hole with the inner diameter of 1 to 500 µm.

Since the temperature in the low temperature sintering may be selected in the range of 150° C. to 300° C. to form these sintered metal layers directly on a printed wiring substrate, prevention of thermal degradation of wiring substrate materials can be attained.

EXAMPLES

In the following, the present invention is described more specifically by referring to Examples. These Examples describe some of the best modes of present invention, but the scope of the present invention is not limited to these embodiments.

Examples 1 to 3, Comparative Example 1

In Examples 1 to 3, paste dispersions having a fluid viscosity appropriate for inkjet printing and containing silver nanoparticles as a conductive medium were prepared by the following procedure.

As a raw material of silver nanoparticles, a commercially available silver ultrafine particle dispersion (product name: Monodisperse Ultrafine Particle Ag1T available from ULVAC Co., Ltd.), more specifically, a dispersion of silver ultrafine particles having an average particle size of 3 nm containing 35 parts by weight of silver ultrafine particles, 7 parts by weight of dodecylamine (molecular weight 185.36, melting point 28.3° C., boiling point 248° C., specific gravity $d_4^{40}$=0.7841) as alkylamine and 58 parts by weight of toluene (boiling point 110.6° C., specific gravity $d_4^{20}$=0.867) as an organic solvent was used. The silver ultrafine particle dispersion has a fluid viscosity of 1 mPa·s (20° C.).

First, 500 g of the silver ultrafine particle dispersion Ag1T (containing 35 wt % of Ag) and 5.8 g of dodecylamine were put in a 1L round bottom flask and mixed, and the mixture was heated and stirred at 80° C. for an hour. After completion of the stirring, the dispersion solvent, toluene, contained in Ag1T was removed by vacuum concentration.

To the mixture from which the solvent was removed was added N14 (tetradecane, viscosity 2.0 to 2.3 mPa·s (20° C.), melting point 5.86° C., boiling point 253.57° C., specific gravity $d_4^{10}$=0.7924, available from Nikko Petrochemicals) in a proportion described in Table 1 per 175 parts by weight of the contained silver ultrafine particles. The mixture was stirred at room temperature (25° C.) to give a uniform dispersion. After completion of the stirring, the dispersion was filtrated through a 0.2 µm membrane filter. The obtained dispersions of Examples 1 to 3 and Comparative Example 1 were all dark blue, uniform high fluidity paste dispersion of silver nanoparticles (silver nanoparticle ink). Table 1 shows values of composition analysis of components contained in the obtained silver nanoparticle dispersion (silver nanoparticle ink) and the fluid viscosity of the dispersion (measured by a B-type rotational viscometer, measured temperature 20° C.). The silver metal in bulk has a density of 10.49 g·cm$^{-3}$ (20° C.) and a resistivity of 1.59 µΩ·cm (20° C.).

TABLE 1

Composition and properties of prepared silver nanoparticle dispersion (silver nanoparticle ink)

|  | Ex. 1 | Ex. 2 | Ex. 3 | Com. Ex. 1 |
| --- | --- | --- | --- | --- |
| silver ultrafine particles (parts by weight) | 175.0 | 175.0 | 175.0 | 175.0 |
| total amount of dodecylamine (parts by weight) | 40.8 | 40.8 | 40.8 | 40.8 |
| tetradecane (parts by weight) | 75.8 | 134.2 | 173.1 | 284.2 |
| content of silver ultrafine particles (% by weight) | 60.0 | 50.0 | 45.0 | 35.0 |
| content of silver ultrafine particles (% by volume) | 10.2 | 7.0 | 5.8 | 3.9 |
| content of tetradecane (% by volume) | 58.5 | 71.4 | 76.3 | 84.1 |
| amount (g) of amine per 100 g of silver (molar quantity) | 23.3 0.126 | 23.3 0.126 | 23.3 0.126 | 23.3 0.126 |
| amount (g) of solvent per 100 g of silver (volume mL) | 43.3 54.6 | 76.7 96.8 | 98.9 124.8 | 185.7 234.3 |
| fluid viscosity (mPa·S) | 8 | 5 | 3 | 1 |

TABLE 2

Application properties of silver nanoparticle dispersion (silver nanoparticle ink) and evaluation results of obtained sintered product

|  | Ex. 1 | Ex. 2 | Ex. 3 | Com. Ex. 1 |
| --- | --- | --- | --- | --- |
| dot diameter per droplet (pm) | 0.6 | 0.7 | 0.9 | 1.5 |
| drawing pitch of dots (µm) | 30 | 30 | 30 | 30 |
| diameter of circular base of coating layer (µm) | 2.5 | 2.5 | 2.5 | >2.5 |
| average height of coating layer (µm) | 20 | 20 | 20 | — |
| diameter of circular base of sintered product layer (µm) | 2.5 | 2.5 | 2.5 | — |
| average height of sintered product layer (µm) | 15 | 13 | 12 | — |
| specific resistivity (µΩ·cm) | 2.2 | 2.4 | 2.5 | — |

Using the obtained silver nanoparticle dispersion, a pattern 2.5 µm in diameter was formed on glass by an ultrafine-droplet fluid ejecting apparatus (ultrafine inkjet apparatus). The diameter of the discharge nozzle of the ultrafine inkjet apparatus was set to 0.6 µm and the amount of droplets to be discharged was set to a common value. As a result, in each silver nano particle dispersion, the diameter of the dot formed from a droplet was as shown in Table 2. Under this drawing condition, the dispersion was repeatedly coated to the same pattern several times by inkjet according to dot/spot pattern in which spot distances are the same to prepare a pillar-shaped silver nanoparticle coating layer with a total layered height shown in Table 2.

In the case of using the silver nanoparticle dispersion of Examples 1 to 3, evaporation of the dispersion solvent contained in the coated film advances in each application and the coated dispersion becomes viscous. On the other hand, although evaporation of the dispersion solvent contained in the coated film also advances in each application in the case of using the silver nanoparticle dispersion of Comparative Example 1, the coated dispersion retains fluidity. After the drawing, the silver nanoparticle coating layer on the glass was subjected to heat treatment at 240° C. for 1 hour to sinter the silver nanoparticle layer, whereby a silver nanoparticle sintered product layer was formed. The diameter of the circular base and the height (thickness) of the obtained sintered product layer were measured according to a microscope observation. Table 2 shows the evaluation results of the dot diameter formed from a droplet and the diameter of the circular base and the height (thickness) of the resulting sintered product layer.

FIG. 1 is a print out of an image of an outer shape of a pillar-shaped metal pillar separately prepared from the silver nanoparticle dispersion of Example 1 observed by a microscope.

A 10×50 mm width pattern was separately formed on a slide glass using the obtained silver nanoparticle dispersion under the inkjet layer-application conditions employed for forming the aforementioned pillar-shaped silver nanoparticle coating layer having a layered height of 50 µm at an average film thickness of stack application of 10 µm. After printing, the nanoparticle ink coating layer on the slide glass was subjected to heat treatment at 240° C. for 1 hour to sinter the silver nanoparticles, whereby an electroconductive layer pattern of a silver nanoparticle sintered product layer was formed. The specific resistivity of the rectangular electroconductive layer prepared from the silver nanoparticle dispersions of Examples 1 to 3 and Comparative Example 1 was measured assuming that the layer was uniform with the thickness being the average layer thickness. The measurement results of the specific resistivity are also shown in Table 2.

Examples 4 and 5, Comparative Example 2

In Examples 4 and 5, paste dispersions having a fluid viscosity appropriate for inkjet printing and containing silver nanoparticles as a conductive medium were prepared by the following procedure.

500 g of the aforementioned silver ultrafine particle dispersion Ag1T (containing 35 wt % of Ag available from ULVAC Co., Ltd.), 87.5 g of 2-ethylhexylamine (boiling point 169° C., available from TOKYO KASEIKOGYO CO., LTD.) (50 wt % based on solid component of Ag) and 52.5 g of dipropylene glycol (30 wt % based on solid component of Ag) were put in a 1L round bottom flask and mixed. The mixture was then heated and stirred at 80° C. for an hour. After completion of the stirring, the dispersion solvent, toluene, contained in Ag1T was removed by vacuum concentration.

The mixture from which the solvent was removed was transferred to a 2L beaker and thereto was added 1,000 g of a polar solvent, acetone, and the mixture was stirred at room temperature for 3 minutes and allowed to stand. In that step, Ag nanoparticles precipitated at the bottom of the beaker upon addition of the polar solvent acetone, stirring and standing. On the other hand, unnecessary organic matters contained in the mixture were dissolved in the supernatant, forming a brown acetone solution. After removing the supernatant layer, 800 g of acetone was added to the precipitate and the mixture was stirred and allowed to stand to precipitate Ag nanoparticles, and the supernatant acetone solution layer was removed. With observing the coloring of the supernatant acetone layer, additional 500 g of acetone was added to the precipitate, and the same procedure was repeated. At the stage where 300 g of acetone was added to the precipitate of the previous step and the mixture was stirred and allowed to stand, the coloring of the supernatant acetone layer was no longer visually observed.

The supernatant acetone layer was removed and then the acetone solvent left in the Ag nanoparticles precipitated at the bottom of the beaker was evaporated and the particles were dried to obtain a blue fine powder.

To the blue fine powder was added N14 (tetradecane,melting point 5.86° C., boiling point 253.57° C., available from Nikko Petrochemicals) in a proportion described in Table 3 per 175 parts by weight of the contained silver ultrafine particles. Thereto was further added 23.4 g of bis-2-ethylhexylamine (boiling point 263° C., available from TOKYO KASEI KOGYO CO., LTD.) and 300 g of hexane, and the mixture was heated and stirred at 70° C. for 30 minutes. As a result of this heating and stirring, the blue fine powder Ag nanoparticles were re-dispersed in the solvent to form a uniform dispersion. After completion of the stirring, the dispersion was filtrated through a 0.2 µm membrane filter, and the solvent, hexane, in the filtrate was removed by vacuum concentration. The dispersions obtained in Examples 4 and 5 and Comparative Example 2 were all dark blue, uniform high fluidity paste dispersion of silver nanoparticles (silver nanoparticle ink).

Table 3 shows values of composition analysis of components contained in the obtained silver nanoparticle dispersion (silver nanoparticle ink) and the fluid viscosity of the dispersion (measured by a B-type rotational viscometer, measured temperature 20° C.).

TABLE 3

| Composition and properties of prepared silver nanoparticle dispersion (silver nanoparticle ink) | | | |
|---|---|---|---|
| | Ex. 4 | Ex. 5 | Com. Ex. 2 |
| silver ultrafine particles (parts by weight) | 175.0 | 175.0 | 175.0 |
| total amount of bis-2-ethylhexylamine (parts by weight) | 23.4 | 23.4 | 23.4 |
| total amount of 2-ethylhexylamine (parts by weight) | 35.8 | 35.8 | 35.8 |
| tetradecane (parts by weight) | 93.6 | 140.4 | 234.0 |
| content of silver ultrafine particles (% by weight) | 53.4 | 46.7 | 35.8 |
| content of silver ultrafine particles (% by volume) | 7.8 | 6.1 | 4.2 |
| content of tetradecane (% by volume) | 57.2 | 66.7 | 77.0 |
| amount (g) of amine per 100 g of silver (molar quantity) | 33.8 0.213 | 33.8 0.213 | 33.8 0.213 |
| amount (g) of solvent per 100 g of silver (volume mL) | 53.5 69.8 | 80.2 104.8 | 133.7 174.3 |
| fluid viscosity (mPa · S) | 10 | 5 | 2 |

TABLE 4

| Application properties of silver nanoparticle dispersion (silver nanoparticle ink) and evaluation results of obtained sintered product | | | |
|---|---|---|---|
| | Ex. 4 | Ex. 5 | Com. Ex. 2 |
| dot diameter per droplet (µm) | 0.6 | 0.7 | 1.2 |
| drawing pitch of dots (µm) | 30 | 30 | 30 |
| diameter of circular base of coating layer (µm) | 2.5 | 2.5 | >2.5 |
| average height of coating layer (µm) | 20 | 20 | — |
| diameter of circular base of sintered product layer (µm) | 2.5 | 2.5 | — |
| average height of sintered product layer (µm) | 15 | 13 | — |
| specific resistivity (µΩ · cm) | 2.6 | 2.7 | — |

Using the obtained silver nanoparticle dispersion, a pattern 2.5 µm in diameter was formed on glass by an ultrafine-droplet fluid ejecting apparatus (ultrafine inkjet apparatus). The diameter of the discharge nozzle of the ultrafine inkjet apparatus was set to 0.6 µm and the amount of droplets to be discharged was set to a common value. As a result, in each silver nanoparticle dispersion, the diameter of the dot formed from a droplet was as shown in Table 4. Under this drawing condition, the dispersion was repeatedly coated to the same pattern several times by inkjet according to dot/spot pattern in which spot distances are the same to prepare a pillar-shaped silver nanoparticle coating layer with a total layered height shown in Table 4.

In the case of using the silver nanoparticle dispersion of Examples 4 and 5, evaporation of the dispersion solvent contained in the coated film advances in each application and the coated dispersion becomes viscous. On the other hand, although evaporation of the dispersion solvent contained in the coated film also advances in each application in the case of using the silver nanoparticle dispersion of Comparative Example 2, the coated dispersion retains fluidity. After the drawing, the silver nanoparticle coating layer on the glass was subjected to heat treatment at 240° C. for 1 hour to sinter the silver nanoparticle layer, whereby a silver nanoparticle sintered product layer was formed. The diameter of the circular base and the height (thickness) of the obtained sintered product layer were measured according to a microscope observation. Table 4 shows the evaluation results of the dot diameter formed from a droplet and the diameter of the circular base and the height (thickness) of the resulting sintered product layer.

A 10×50 mm width pattern was separately formed on a slide glass using the obtained silver nanoparticle dispersion under the inkjet layer-application conditions employed forming the aforementioned pillar-shaped silver nanoparticle coating layer having a layered height of 50 μm at an average film thickness of stack application of 10 μm. After printing, the nanoparticle ink coating layer on the slide glass was subjected to heat treatment at 240° C. for 1 hour to sinter the silver nanoparticles, whereby an electroconductive layer pattern of a silver nanoparticle sintered product layer was formed. The specific resistivity of the rectangular electroconductive layer prepared from the silver nanoparticle dispersions of Examples 4 and 5 was measured assuming that the layer was uniform with the thickness being the average layer thickness. The measurement results of the specific resistivity are also shown in Table 4.

Examples 6 and 7, Comparative Example 3

In Examples 6 and 7, paste dispersions having a fluid viscosity appropriate for inkjet printing and containing gold nanoparticles as a conductive medium were prepared by the following procedure.

60 g of a gold ultrafine particle dispersion Au1T (containing 30 wt % of Au, available from ULVAC Co., Ltd.), 9.0 g of 2-ethylhexylamine (boiling point 169° C., available from TOKYO KASEI KOGYO CO., LTD.) (50 wt % based on solid component of Au) and 3.6 g of water (20 wt % based on solid component of Au) were put in a 200 mL round bottom flask and mixed. The mixture was then heated and stirred at 80° C. for 30 minutes. After completion of the stirring, the dispersion solvent, toluene, contained in Au1T was removed by vacuum concentration.

The mixture from which the solvent was removed was transferred to a 500 mL beaker and thereto was added 300 g of a polar solvent, acetonitrile, and the mixture was stirred at room temperature for 3 minutes and allowed to stand. In that step, Au nanoparticles precipitated at the bottom of the beaker upon addition of the polar solvent acetonitrile, stirring and standing. On the other hand, unnecessary organic matters contained in the mixture were dissolved in the supernatant, forming a brown acetonitrile solution. After removing the supernatant layer, 300 g of acetonitrile was added to the precipitate and the mixture was stirred and allowed to stand to precipitate Au nanoparticles, and the supernatant acetonitrile solution layer was removed. With observing the coloring of the supernatant acetonitrile layer, additional 300 g of acetonitrile was added to the precipitate and the mixture was stirred and allowed to stand. At this stage, the coloring of the supernatant acetonitrile layer was no longer visually observed.

The supernatant acetonitrile layer was removed and the acetonitrile solvent left in Au nanoparticles precipitated at the bottom of the beaker was evaporated and the particles were dried to obtain black fine powder.

To the black fine powder was added AF7 solvent (melting point 259 to 282° C., fluidization point −30° C., available from NIPPON OIL CORPORATION) in a proportion described in Table 5 per 18 parts by weight of the contained ultrafine gold particles. Thereto was further added 2.089 g of 2-ethylhexylamine (boiling point 169° C., available from TOKYO KASEI KOGYO CO., LTD.), 2.732 g of bis-2-ethylhexylamine (boiling point 263° C., available from TOKYO KASEI KOGYO CO., LTD.) and 100 g of toluene, and the mixture was heated and stirred at 65° C. for 30 minutes. As a result of this heating and stirring, the black fine powder Au nanoparticles were re-dispersed in the solvent to form a uniform dispersion. After completion of the stirring, the dispersion was filtrated through a 0.2 μm membrane filter, and toluene in the filtrate was removed by vaccuum concentration. The dispersions obtained in Examples 6 and 7Comparative Example 3 were all dark red , uniform high fluidity paste dispersion of gold nanoparticles (gold nanoparticle ink).

Table 4 shows values of composition analysis of components contained in the obtained gold nanoparticle dispersion (gold nanoparticle ink) and the fluid viscosity of the dispersion (measured by a B-type rotational viscometer, measured temperature 20° C.) The gold metal in bulk has a density of 19.32 g·cm$^{-3}$ (20° C.) and a resistivity of 2.2 μΩ·cm (20° C.).

TABLE 5

Composition and properties of prepared gold nanoparticle dispersion (gold nanoparticle ink)

| | Ex. 6 | Ex. 7 | Com. Ex. 3 |
|---|---|---|---|
| Gold ultrafine particles (parts by weight) | 18.0 | 18.0 | 18.0 |
| total amount of bis-2-ethylhexylamine (parts by weight) | 2.040 | 2.040 | 2.040 |
| total amount of 2-ethylhexylamine (parts by weight) | 5.289 | 5.289 | 5.289 |
| AF7 solvent (parts by weight) | 8.40 | 12.60 | 25.20 |
| content of gold ultrafine particles (% by weight) | 53.4 | 47.5 | 35.6 |
| content of gold ultrafine particles (% by volume) | 4.6 | 3.7 | 2.3 |
| content of AF7 solvent (% by volume) | 49.8 | 59.8 | 74.8 |
| amount (g) of amine per 100 g of gold (molar quantity) | 40.7 0.274 | 40.7 0.274 | 40.7 0.274 |
| amount (g) of solvent per 100 g of gold (volume mL) | 46.7 56.0 | 70.0 83.9 | 140.0 167.9 |
| fluid viscosity (mPa · S) | 12 | 7 | 3 |

TABLE 6

Application properties of gold nanoparticle dispersion (gold nanoparticle ink) and evaluation results of obtained sintered product

|  | Ex. 6 | Ex. 7 | Com. Ex. 3 |
|---|---|---|---|
| dot diameter per droplet (μm) | 0.7 | 0.8 | 1.9 |
| drawing pitch of dots (μm) | 30 | 30 | 30 |
| diameter of circular base of coating layer (μm) | 8.0 | 8.0 | >8.0 |
| average height of coating layer (μm) | 10.0 | 10.0 | — |
| diameter of circular base of sintered product layer (μm) | 8.0 | 8.0 | — |
| average height of sintered product layer (μm) | 7.0 | 6.7 | — |
| specific resistivity (μΩ · cm) | 3.1 | 3.4 | — |

Using the obtained gold nanoparticle dispersion, a pattern 8.0 μm in diameter was formed on glass by an ultrafine-droplet fluid ejecting apparatus (ultrafine inkjet apparatus). The diameter of the discharge nozzle of the ultrafine inkjet apparatus was set to 0.6 μm and the amount of droplets to be discharged was set to a common value. As a result, in each silver nanoparticle dispersion, the diameter of the dot formed from a droplet was as shown in Table 6. Under this drawing condition, the dispersion was repeatedly coated to the same pattern several times by inkjet according to dot/spot pattern in which spot distances are the same to prepare a conical gold nanoparticle coating layer with a total layered height shown in Table 6.

Figure 2:
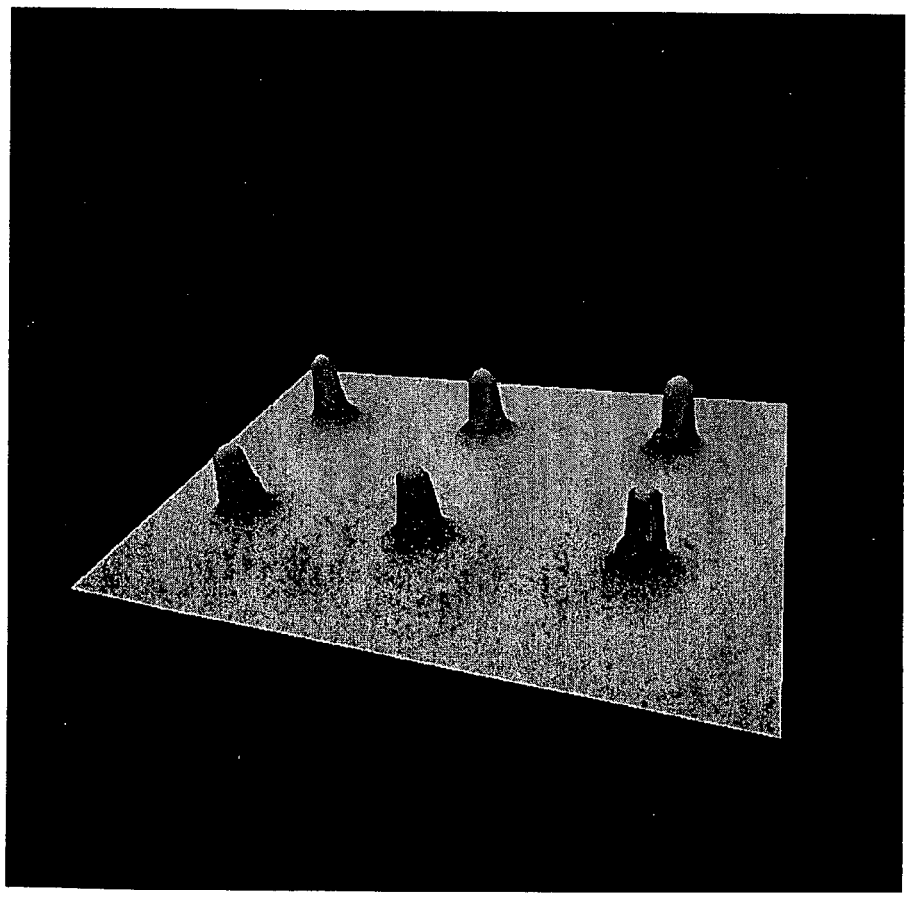
FIG. 2 is a print out of an image of an outer shape of a disc-like (conical socle) metal bump composed of the sintered product layer of gold nanoparticles as explained in Example 6, which is observed by a microscope (laser microscope)

In the case of using the gold nanoparticle dispersion of Examples 6 and 7, evaporation of the dispersion solvent contained in the coated film advances in each application and the coated dispersion becomes viscous. On the other hand, although evaporation of the dispersion solvent contained in the coated film also advances in each application in the case of using the gold nanoparticle dispersion of Comparative Example 3, the coated dispersion retains fluidity. After the drawing, the gold nanoparticles coating layer on the glass was subjected to heat treatment at 240° C. for 1 hour to sinter the gold nanoparticle layer, whereby a gold nanoparticle sintered product layer was formed. The diameter of the circular base and the height (thickness) of the obtained sintered product layer were measured according to a microscope observation. Table 6 shows the evaluation results of the dot diameter formed from a droplet and the diameter of the circular base and the height (thickness) of the resulting sintered product layer. FIG. 2 is a print out of an image of an outer shape of a disc-like (conical socle) metal bump formed from the gold nanoparticle sintered product prepared using the gold nanoparticle dispersion of Example 6 observed by a laser microscope.

A 10×50 mm width pattern was separately formed on a slide glass using the obtained gold nanoparticle dispersion under the inkjet layer-application conditions employed for forming the conical gold nanoparticle coating layer having a layered height of 5 μm at an average film thickness of stack application of 3 μm. After printing, the nanoparticle ink coating layer on the slide glass was subjected to heat treatment at 240° C. for 1 hour to sinter the incorporated gold nanoparticles, whereby an electroconductive layer pattern of a gold nanoparticle sintered product layer was formed. The specific resistivity of the rectangular electroconductive layer prepared from the gold nanoparticle dispersions of Examples 6 and 7 was measured assuming that the layer was uniform with the thickness being the average layer thickness. The measurement results of the specific resistivity are also shown in Table 6.

Reference Examples 1 to 3

The amount added of the components other than the dispersion solvent of the above-described silver nanoparticle dispersion of Example 3, the silver nanoparticle dispersion of Example 5 and the gold nanoparticle dispersion of Example 7 was the same and the amount of the dispersion solvent was reduced to 1/2 to prepare a viscous, paste dispersions of Reference Examples 1 to 3.

The content of the dispersion solvent in the prepared viscous paste dispersions of Reference Examples 1 to 3 was calculated and the fluid viscosity of the paste dispersions was measured by a spiral viscometer (measurement temperature 23° C.). Table 7 shows the content of the dispersion solvent in the viscous paste dispersions of Reference Examples 1 to 3 and the measured fluid viscosity thereof.

TABLE 7

Fluid viscosity and content of dispersion solvent in prepared viscous paste dispersion (nanoparticle paste)

|  | Ref. Ex. 1 | Ref. Ex. 2 | Ref. Ex. 3 |
|---|---|---|---|
| referred base for amount of components other than dispersion solvent | Ex. 3 | Ex. 5 | Ex. 7 |
| content of dispersion solvent (% by volume) | 42 | 45 | 43 |
| fluid viscosity (23° C.) | 70 | 50 | 40 |

Example 8

Figure 3:
FIG. 3 is a print out of an image of an outer shape of a disc-like (conical socle) metal bump composed of the sintered product layer of silver nanoparticles as explained in Example 8, which is observed by a microscope (SEM).

Using the silver nanoparticle dispersion prepared in Example 1, a disc-like pattern whose base is 4.5 μm in diameter is formed on glass by an ultrafine-droplet fluid ejecting apparatus (ultrafine inkjet apparatus). The drawing condition was the same as that of Example 1. The coated film thickness per application was 0.3 μm and the dispersion was repeatedly coated to the same pattern several times to prepare a disc-like silver nanoparticle coating layer having a layered thickness of 3.5 μm. After the drawing, the disc-like silver nanoparticle layer on the glass was subjected to heat treatment at 240°C. for 1 hour to sinter the silver nanoparticle layer, whereby a silver nanoparticle sintered product layer was formed. Regarding the outer shape of the obtained sintered product layer, the layer is a disc-like (conical socle) sintered metal pad having a circular base 4.5 μm in diameter and a thickness of 2.5 μm. FIG. 3 is a print out of an image of an outer shape of a sintered metal pad separately prepared under the same conditions observed by a microscope.

Example 9

Through holes 200 μm in diameter extending between the upper layer surface and the back side (lower layer surface) were formed on a multilayer wiring substrate material. The upper layer of the multilayer wiring substrate on which through holes are made had a thickness of 1.6 mm. The diameter/depth ratio, i.e., the aspect ratio of the through hole is set to as high as 1/8. On the back side, a lower surface wiring layer is disposed, and the buried electroconductive member provided in the through hole constitutes via hole connection.

Using the silver nanoparticle dispersion prepared in Example 1, a buried type coating layer of silver nanoparticles is formed in a through hole 200 μm in diameter by an ultrafine-droplet fluid ejecting apparatus (ultrafine inkjet apparatus). The drawing condition was the same as that of Example 1. The coated film thickness per application was 0.3 μm and the dispersion was repeatedly coated to the through hole several times to prepare a silver nanoparticle layer filling up the 1.6 mm deep through hole. After the filling, the silver nanoparticle layer in the through hole was subjected to heat treatment at 240° C. for 1 hour to sinter the silver nanoparticle layer, whereby a filled layer of sintered silver nanoparticles was formed.

The obtained filled layer of sintered silver nanoparticles is closely adhered to the sidewall of the through hole.

INDUSTRIAL APPLICABILITY

The metal nanoparticle dispersion according to the present invention can be used for forming a sintered product layer of metal nanoparticles, which is usable for forming a fine circuit wiring pattern as well as for preparation of a minute conductive member having a high aspect ratio that is formed with use of a thick electroconductive layer, in various substrates for wiring circuit.

The invention claimed is:

1. A metal nanoparticle dispersion usable for layered coating by spraying in the form of fine droplets,
   wherein
   an average particle size of said metal nanoparticles is selected in the range of 1 to 100 μm, and in the metal nanoparticle dispersion, the content of metal nanoparticles is chosen at 40% by weight or more;
   the metal nanoparticle dispersion is a dispersion that consists of the metal nanoparticles, one or more compounds having a group containing a nitrogen atom and a dispersion solvent, wherein, said metal nanoparticles are uniformly dispersed, as a solid component, in the dispersion solvent;
   the surface of the metal nanoparticle is coated with one compound or more which has a group containing a nitrogen atom and capable of coordinate-bonding by a lone pair existing in the nitrogen atom as a group capable of coordinate-bonding to a metal element contained in the metal nanoparticle;
   the coating of said one or more compounds having the group containing the nitrogen atom on the surface of the metal nanoparticle is attained through the coordinate-bonding of the group containing the nitrogen atom to the metal element by the lone pair existing in the nitrogen atom contained in the group;
   said one or more compounds having the group containing the nitrogen atom is contained in a total amount of 20 to 50 parts by weight based on 100 parts by weight of said metal nanoparticles;
   said dispersion solvent is a type of organic solvent or a mixed solvent of two or more organic liquids, which shows homogeneous liquid state at least at a temperature of 15° C. or higher, wherein the type of organic solvent or at least one of the two or more organic liquids, which composes the dispersion solvent, has affinity for said one compound or more having the group containing the nitrogen atom;
   a fluid viscosity (20° C.) of the dispersion solvent is chosen in the range of 0.2 mPa·s to 3 mPa·s;
   in said metal nanoparticle dispersion, a volume percentage of said dispersion solvent is selected in the range of 55 to 80% by volume, and a fluid viscosity (20° C.) of the metal nanoparticle dispersion is chosen in the range of 2 mPa·s to 30 mPa·s; and
   when a concentrated dispersion is formed from the metal nanoparticle dispersion by evaporating a part of the dispersion solvent contained in said metal nanoparticle dispersion so to set a volume percentage of said dispersion solvent in the range of 20 to 50% by volume, the concentrated dispersion comes to be a viscous concentrated solution having a fluid viscosity (20° C.) being within the range of 20 Pa·s to 1000 Pa·s.

2. The metal nanoparticle dispersion claimed in claim 1, wherein the average particle size of said metal nanoparticles is selected in the range of 1 to 20 nm.

3. The metal nanoparticle dispersion claimed in claim 1, wherein the metal nanoparticle is a metal nanoparticle made of a metal selected from the group consisting of gold, silver, copper, platinum, palladium, tungsten, nickel, tantalum, bismuth, lead, indium, tin, zinc, titanium and aluminum, or a metal nanoparticle composed of an alloy of two or more metals selected from the group of metals.

4. The metal nanoparticle dispersion claimed in claim 1, wherein as for said one type of the organic solvent or the two or more types of organic liquids that compose the dispersion solvent, at least one of those is an organic solvent of which a melting point is 20° C. or lower and a boiling point is within the range of 80 to 300° C.

5. The metal nanoparticle dispersion claimed in claim 1, wherein said dispersion solvent is a type of organic solvent or a mixed solvent of two or more organic liquids, which has such a high solvency that 50 parts by weight or more of the compound having the group containing the nitrogen atom, which is used for covering the metal nanoparticle surface, can be dissolved per 100 parts by weight of the dispersion solvent when heated up to 100° C. or higher.

6. The metal nanoparticle dispersion claimed in claim 1, wherein said metal nanoparticles are gold nanoparticles, the average particle size of the metal nanoparticles is selected in the range of 1 to 20 nm, and in the metal nanoparticle dispersion, the content of the metal nanoparticles is chosen at 40% by weight or more.

7. The metal nanoparticle dispersion claimed in claim 1, wherein said metal nanoparticles are silver nanoparticles, the average particle size of the metal nanoparticles is selected in the range of 1 to 20 nm, and in the metal nanoparticle dispersion, the content of the metal nanoparticles is chosen at 40% by weight or more.

8. The metal nanoparticle dispersion claimed in claim 1, wherein the metal nanoparticle is a metal nanoparticle made of a metal selected from the group consisting of gold, silver, copper, platinum, palladium.

9. The metal nanoparticle dispersion claimed in claim 1, wherein said dispersion solvent is selected from the group consisting of non-polar organic solvents having a boiling point of 150° C. or higher, but lower than 300° C., or is selected from the group consisting of low polarity organic solvents having a boiling point of 150° C. or higher, but lower than 300° C.

10. The metal nanoparticle dispersion claimed in claim 1, wherein said one or more compounds having the group containing the nitrogen atom is selected from the group consisting of alkylamines in the form of primary amine and alkylamines in the form of secondary amine.

11. A process for forming, on a substrate, an electroconductive layer with good conductivity, which is consisting of a sintered product layer of metal nanoparticles using the metal nanoparticle dispersion as claimed in claim 1,
   wherein the sintered product layer contains a region in which a layer thickness is set up to 1 μm or more and a ratio of thickness/width of the layer shows a high aspect ratio of 1/4 or higher,
   the process comprising the steps of:
   forming a layered coating film, the thickness of which exceeds the layer thickness of said sintered product layer for the region showing said high aspect ratio by repeating multiple times the treatment of providing a coating layer having coating film thickness set in the range of 0.1 μm each time by discharging said metal nanoparticle dispersion in the form of fine droplets onto the planar pattern of fine shape, and
   forming a sintered product layer of the metal nanoparticles by carrying out treatment for baking the metal nanoparticles contained in the layered coating film of the metal nanoparticle dispersion,
   wherein, in the step of forming said layered coating film, after the metal nanoparticle dispersion is discharged in the form of fine droplets, in a course of the fine droplets coming into impact on the surface to be coated, a part of the dispersion solvent included in the fine droplets is evaporated, whereby concentrated droplets are coated to the surface,
   the formation of the sintered product layer of metal nanoparticles is conducted by heating the coating layer up to a temperature being not higher than 300° C., and
   when the heating is carried out for treatment of baking, the compound having the group containing the nitrogen atom that is used for covering the surface of the metal nanoparticle is separated from the metal nanoparticle surface and dissolved into the dispersion solvent having a high solvency, for which a type of organic solvent or mixed solvent of two or more organic liquids is used, and thereby surface contact of the metal nanoparticles is attained, whereby the metal nanoparticles are sintered with each other and the dispersion solvent is removed by evaporation.

12. The process for forming an electroconductive layer according to claim 11,
   wherein, in the step of forming the layered coating film by discharging said metal nanoparticle dispersion in the form of fine droplets, the method of discharging said metal nanoparticle dispersion in the form of fine droplets is selected from deposition or inkjet printing.

13. The process for forming an electroconductive layer according to claim 11,
   wherein the heat-treatment temperature for forming the sintered product layer of metal nanoparticles is chosen in the range of 150° C. to 300° C.

14. The process for forming an electroconductive layer according to claim 13,
   wherein the metal nanoparticles are nanoparticles made of a metal selected from the group consisting of gold, silver, copper, platinum and palladium.

15. The process for forming an electroconductive layer according to claim 14,
   wherein the metal nanoparticles are gold or silver nanoparticles, and
   the average particle size of the metal nanoparticles is selected in the range of 1 to 20 nm.

16. The process for forming an electroconductive layer according to claim 11,
   wherein the average particle size of said metal nanoparticles is selected in the range of 1 to 20 nm, and in the metal nanoparticle dispersion, the content of metal nanoparticles is chosen at 40% by weight or more.

17. The process for forming an electroconductive layer according to claim 11,
   wherein as for said one type of the organic solvent or the two or more types of organic liquids that compose the dispersion solvent, at least one of those is an organic solvent of which a melting point is 20° C. or lower and a boiling point is within the range of 80 to 300° C.

18. The process for forming an electroconductive layer according to claim 11,
   wherein said dispersion solvent is a type of organic solvent or a mixed solvent of two or more organic liquids, which has such a high solvency that 50 parts by weight or more of the compound having the group containing the nitrogen atom, which is used for covering the metal nanoparticle surface, can be dissolved per 100 parts by weight of the dispersion solvent when heated up to 100° C. or higher.

19. The process for forming an electroconductive layer according to claim 11,
   wherein said dispersion solvent is selected from the group consisting of non-polar organic solvents having a boiling point of 150° C. or higher, but lower than 300° C., or is selected from the group consisting of low polarity organic solvents having a boiling point of 150° C. or higher, but lower than 300° C.

20. The process for forming an electroconductive layer according to claim 11,
   wherein said one or more compounds having the group containing the nitrogen atom is selected from the group consisting of alkylamines in the form of primary amine and alkylamines in the form of secondary amine.

* * * * *